US012574006B2

(12) United States Patent
Kawai et al.

(10) Patent No.: US 12,574,006 B2
(45) Date of Patent: Mar. 10, 2026

(54) RESONATOR AND RESONANCE DEVICE

(71) Applicant: Murata Manufacturing Co., Ltd.,
Nagaokakyo (JP)

(72) Inventors: Ryota Kawai, Nagaokakyo (JP);
Yoshiyuki Higuchi, Nagaokakyo (JP);
Masakazu Fukumitsu, Nagaokakyo
(JP); Fumiya Endou, Nagaokakyo (JP);
Takehiko Kishi, Nagaokakyo (JP);
Ville Kaajakari, Helsinki (FI)

(73) Assignee: **MURATA MANUFACTURING CO.,
LTD.**, Nagaokakyo (JP)

( * ) Notice: Subject to any disclaimer, the term of this
patent is extended or adjusted under 35
U.S.C. 154(b) by 147 days.

(21) Appl. No.: 18/416,189

(22) Filed: Jan. 18, 2024

(65) Prior Publication Data

US 2024/0154600 A1      May 9, 2024

Related U.S. Application Data

(63) Continuation of application No.
PCT/JP2022/015912, filed on Mar. 30, 2022.

(30) Foreign Application Priority Data

Aug. 3, 2021    (JP) ................................. 2021-127267

(51) Int. Cl.
*H03H 9/17* (2006.01)
*H03H 9/02* (2006.01)
(Continued)

(52) U.S. Cl.
CPC ........ *H03H 9/173* (2013.01); *H03H 9/02448*
(2013.01); *H03H 9/0595* (2013.01); *H03H
9/2468* (2013.01)

(58) Field of Classification Search
CPC .. H03H 9/173; H03H 9/02448; H03H 9/0595;
H03H 9/2468; H03H 9/1057; H03H
9/2489
(Continued)

(56) References Cited

U.S. PATENT DOCUMENTS

| 4,037,179 A | 7/1977 | Terayama |
| 7,015,631 B2 | 3/2006 | Hirasawa et al. |

(Continued)

FOREIGN PATENT DOCUMENTS

| JP | S4837390 B1 | 11/1973 |
| JP | S5160137 A | 5/1976 |

(Continued)

OTHER PUBLICATIONS

English Translation of International Search Report received for PCT
Patent Application No. PCT/JP2022/015912, mailed on Jun. 28,
2022, 4 pages.

*Primary Examiner* — Jorge L Salazar, Jr.
(74) *Attorney, Agent, or Firm* — ArentFox Schiff LLP

(57) ABSTRACT

A resonance device is provided that includes a resonator
including a base, a plurality of vibration arms having arms
on a fixed end side connected to the base and weight portions
on an open end side. A frame is around a periphery of the
vibration arms and holds the base. The vibration arms
extending parallel to each other and vibrating in an out-of-
plane bending vibration mode as a main vibration. A lower
cover and an upper form a vibration space for the resonator.
A protrusion protrudes into the vibration space from an inner
surface of the lower or upper cover. The frame has projec-
tions formed in positions facing the weight portions in a plan
view.

18 Claims, 13 Drawing Sheets

(51) Int. Cl.
     *H03H 9/05*        (2006.01)
     *H03H 9/24*        (2006.01)
(58) Field of Classification Search
     USPC .......................................................... 333/186
     See application file for complete search history.

(56)                References Cited

U.S. PATENT DOCUMENTS

| | | | |
|---|---|---|---|
| 11,329,624 | B2 | 5/2022 | Goto et al. |
| 11,750,173 | B2 | 9/2023 | Kawai et al. |
| 2016/0260887 | A1* | 9/2016 | Fujii ........................ H03H 9/10 |
| 2021/0013869 | A1* | 1/2021 | Yamada ............. H03H 9/02157 |
| 2022/0231663 | A1 | 7/2022 | Fukumitsu et al. |

FOREIGN PATENT DOCUMENTS

| | | |
|---|---|---|
| JP | 2005-102138 A | 4/2005 |
| JP | 2011-205266 A | 10/2011 |
| JP | 2014-131352 A | 7/2014 |
| WO | 2018/008480 A1 | 1/2018 |
| WO | 2019/207829 A1 | 10/2019 |
| WO | 2021/117272 A1 | 6/2021 |

* cited by examiner

RESONATOR AND RESONANCE DEVICE

CROSS REFERENCE TO RELATED APPLICATIONS

This application is a continuation of International Application No. PCT/JP2022/015912, filed Mar. 30, 2022, which claims priority to Japanese Patent Application No. 2021-127267, filed Aug. 3, 2021, the entire contents of each of which are hereby incorporated by reference in their entirety.

TECHNICAL FIELD

The present invention relates to a resonator and a resonance device in which a plurality of vibration arms vibrate in an out-of-plane bending vibration mode.

BACKGROUND

Resonance devices using MEMS (Micro Electro Mechanical Systems) technology have heretofore been used as timing devices, for example. These resonance devices are generally mounted on a printed circuit board that is incorporated into an electronic device such as a smartphone. The resonance devices include a lower substrate, an upper substrate that forms a cavity with the lower substrate, and a resonator disposed inside the cavity between the lower substrate and the upper substrate.

For example, International Publication No. 2019/207829 (hereinafter "Patent Document 1") discloses a resonator including a vibration section having a base and a plurality of vibration arms each having a fixed end connected to the base and an open end provided at a distance from the base and extending from the fixed end to the open end. Moreover, the base and the plurality of vibration arms have a piezoelectric film, a lower electrode and an upper electrode provided so as to face each other across the piezoelectric film, and an insulating film provided so as to cover the upper electrode. A holding section is provided so as to extend on the open end side of the plurality of vibration arms; and a holding arm connects the vibration section to the holding section. The resonator further includes an upper cover provided facing the upper electrode of the resonator and a lower cover provided facing the lower electrode of the resonator. The lower cover has a protrusion that protrudes between two adjacent vibration arms among the plurality of vibration arms. The protrusion has an insulating film. The vibration arm has a weight portion that is provided on the open end side and is wider than other part of the vibration arm. The weight portion has a conductive film formed on the insulating film. When a surface of the lower cover facing the lower electrode is viewed in a plan view, a second distance between the weight portion of one of the two adjacent vibration arms and the protrusion is larger than a first distance between the weight portion and the holding section. This resonator prevents electric charges on the insulating layer in the resonator or the conductive layer on the insulating layer from affecting a resonant frequency.

In a resonance device of the related art, when vibration arms are significantly displaced in at least one of an X-axis direction and a Y-axis direction due to an impact such as a fall, an unexpectedly large stress may be generated in a resonator. As a result, a large stress is applied to a portion with the largest stress generated, for example, a support arm connecting a base and a holding section, resulting in a risk that the support arm or the surrounding area of the support arm may be damaged.

SUMMARY OF THE INVENTION

Accordingly, it is an object of the present invention to provide a resonance device that reduces stress generated in a resonator by an impact.

In an exemplary aspect, a resonance device is provided that includes a resonator including a base, three or more vibration arms having arm portions on a side of a fixed end connected to the base and weight portions formed on a side of an open end, and a frame disposed at least in a part of a periphery of the plurality of vibration arms and configured to hold the base. The vibration arms extend parallel to each other and vibrate in an out-of-plane bending vibration mode as a main vibration. The resonance device includes a first substrate; a second substrate that forms a vibration space for the resonator with the first substrate; and a protrusion that protrudes into the vibration space from an inner surface of the first substrate or the second substrate. The holding section has a first projection formed in a position facing a weight portion of at least one of the plurality of vibration arms in a plan view of the resonator.

Moreover, a resonance device according to another aspect includes a resonator including a base, three or more vibration arms having arm portions on a side of a fixed end connected to the base and weight portions formed on a side of an open end, and a frame disposed at least in a part of a periphery of the plurality of vibration arms and configured to hold the base. The vibration arms extend parallel to each other and vibrate in an out-of-plane bending vibration mode as a main vibration. The resonance device includes a first substrate; a second substrate that forms a vibration space for the resonator with the first substrate; and a first protrusion that protrudes into the vibration space from an inner surface of the first substrate or the second substrate, and faces a weight portion of at least one of the plurality of vibration arms.

According to the exemplary aspects of the present invention, stress generated in the resonator by an impact is reduced.

DETAILED DESCRIPTION OF EMBODIMENTS

Figure 1:
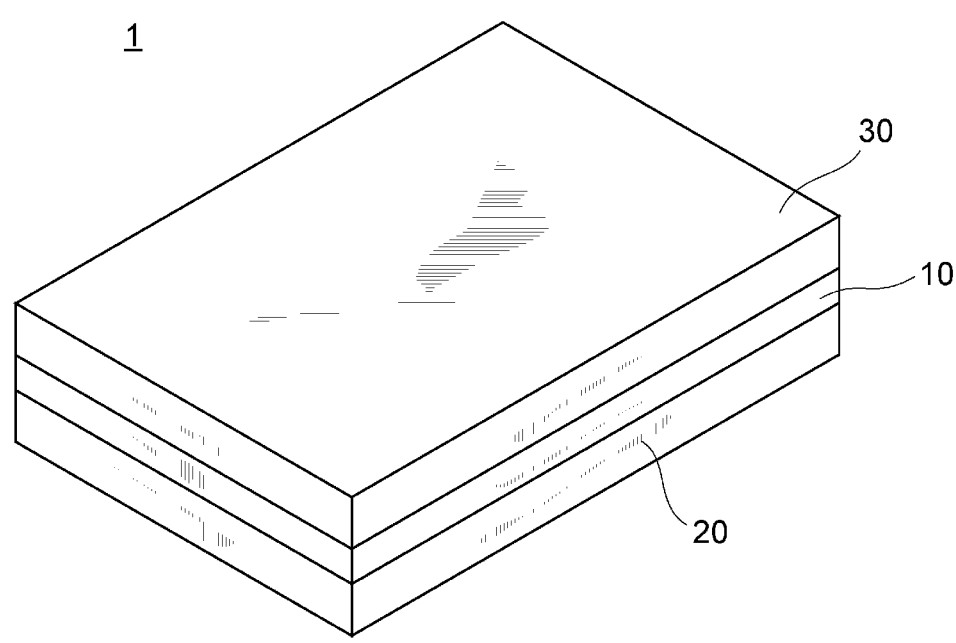
FIG. 1 is a perspective view schematically illustrating an external appearance of a resonance device according to a first exemplary embodiment.
Figure 1:
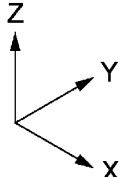

Exemplary embodiments of the present invention will be described below. In the following description of the drawings, the same or similar constituent components are denoted by the same or similar reference numerals. The drawings are for illustrative purposes only and the dimensions and shapes of each part are schematic. Therefore, the technical scope of the exemplary aspects should not be construed as being limited to the embodiments.

First Exemplary Embodiment

Figure 2:
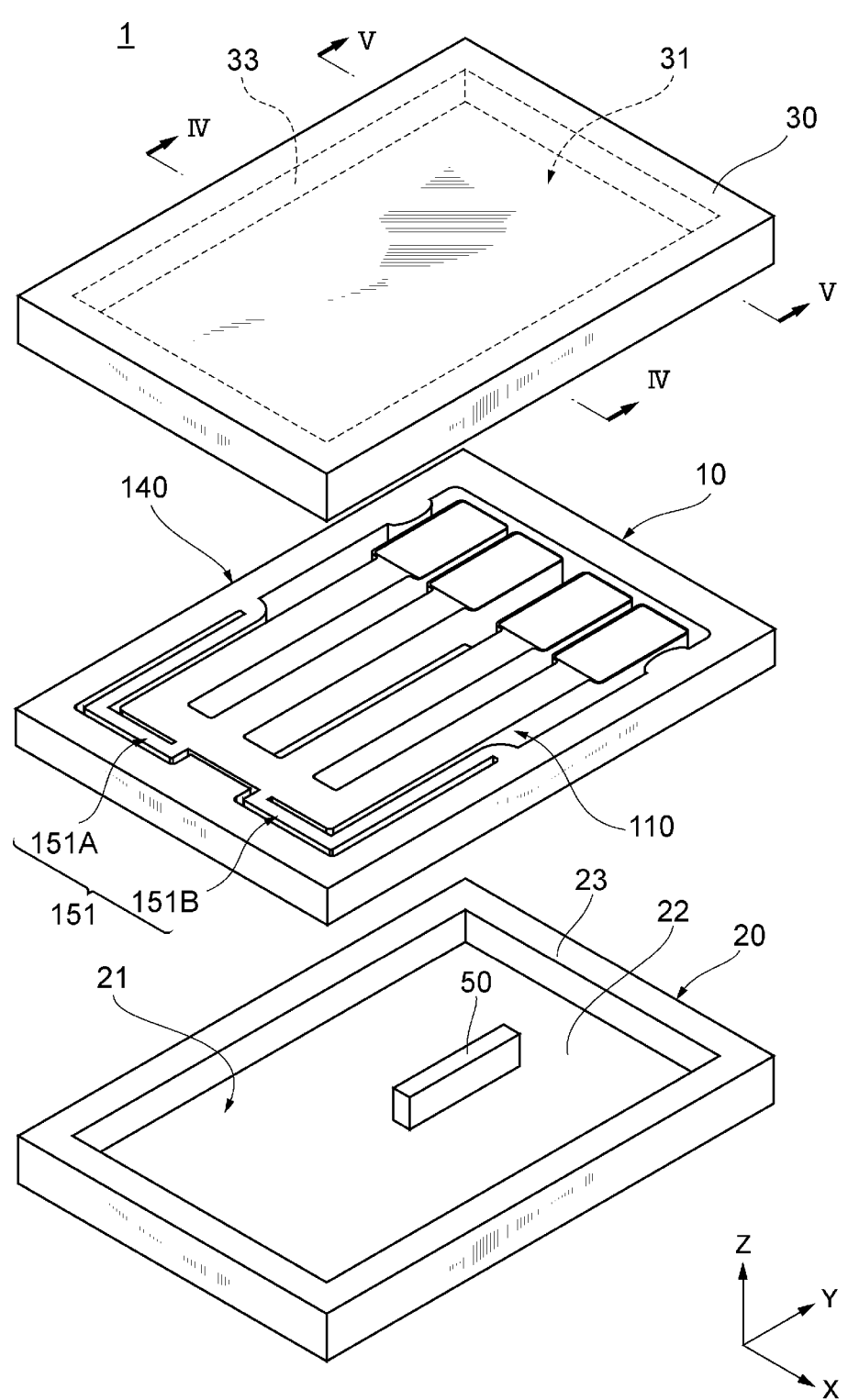
FIG. 2 is an exploded perspective view schematically illustrating a structure of the resonance device illustrated in FIG. 1.

First, a schematic configuration of a resonance device according to a first exemplary embodiment will be described with reference to FIGS. 1 and 2. FIG. 1 is a perspective view schematically illustrating the appearance of a resonance device 1 according to the first exemplary embodiment. FIG. 2 is an exploded perspective view schematically illustrating a structure of the resonance device 1 illustrated in FIG. 1.

The resonance device 1 includes a lower cover 20, a resonator 10, and an upper cover 30. That is, the resonance device 1 has a configuration in which the lower cover 20, the resonator 10, and the upper cover 30 are stacked in this order. The lower cover 20 and the upper cover 30 are disposed so as to face each other with the resonator 10 interposed therebetween. For purposes of this disclosure, the lower cover 20 corresponds to an example of a "first substrate", while the upper cover 30 corresponds to an example of a "second substrate".

Each configuration of the resonance device 1 will be described below. The following description is given assuming that the side of the resonance device 1 where the upper cover 30 is provided is top (or front) and the side thereof where the lower cover 20 is provided is bottom (or back).

In an exemplary aspect, the resonator 10 is a MEMS resonator manufactured using MEMS technology. The resonator 10, the lower cover 20, and the upper cover 30 are joined together so that the resonator 10 is sealed and a vibration space for the resonator 10 is formed. The resonator 10, the lower cover 20, and the upper cover 30 are each formed using a silicon (Si) substrate (hereinafter referred to as "Si substrate"). These Si substrates are bonded to each other. Note that the resonator 10, the lower cover 20, and the upper cover 30 may each be formed using an SOI (Silicon On Insulator) substrate having a silicon layer and a silicon oxide film laminated therein.

As illustrated, the lower cover 20 includes a rectangular flat bottom plate 22 provided along an XY plane, and a sidewall 23 extending in a Z-axis direction, that is, in a stacking direction of the lower cover 20 and the resonator 10 from a peripheral edge of the bottom plate 22. A recess 21 defined by the surface of the bottom plate 22 and the inner surface of the sidewall 23 is formed in the lower cover 20 on the side facing the resonator 10. The recess 21 forms at least a part of the vibration space for the resonator 10. The lower cover 20 may have a flat configuration without the recess 21. A getter layer may be formed on the surface of the recess 21 of the lower cover 20 on the resonator 10 side.

In an exemplary aspect, the lower cover 20 also includes a protrusion 50 formed on the surface of the bottom plate 22. A configuration of the protrusion 50 will be described in detail later.

The upper cover 30 forms the vibration space with the lower cover 20, which is a space in which the resonator 10 vibrates. The upper cover 30 includes a rectangular flat bottom plate 32 provided along the XY plane, and a sidewall 33 extending in the Z-axis direction from the peripheral edge of the bottom plate 22. A recess 31 defined by the surface of the bottom plate 32 and the inner surface of the sidewall 23 is formed in the upper cover 30 on the side facing the resonator 10. The recess 31 forms at least a part of the vibration space for the resonator 10. The upper cover 30 may have a flat configuration without the recess 31. A getter layer may be formed on the surface of the recess 31 of the upper cover 30 on the resonator 10 side.

By joining the upper cover 30, the resonator 10, and the lower cover 20, the vibration space for the resonator 10 is hermetically sealed and a vacuum state is maintained. This vibration space may be filled with a gas such as an inert gas, for example.

Figure 3:
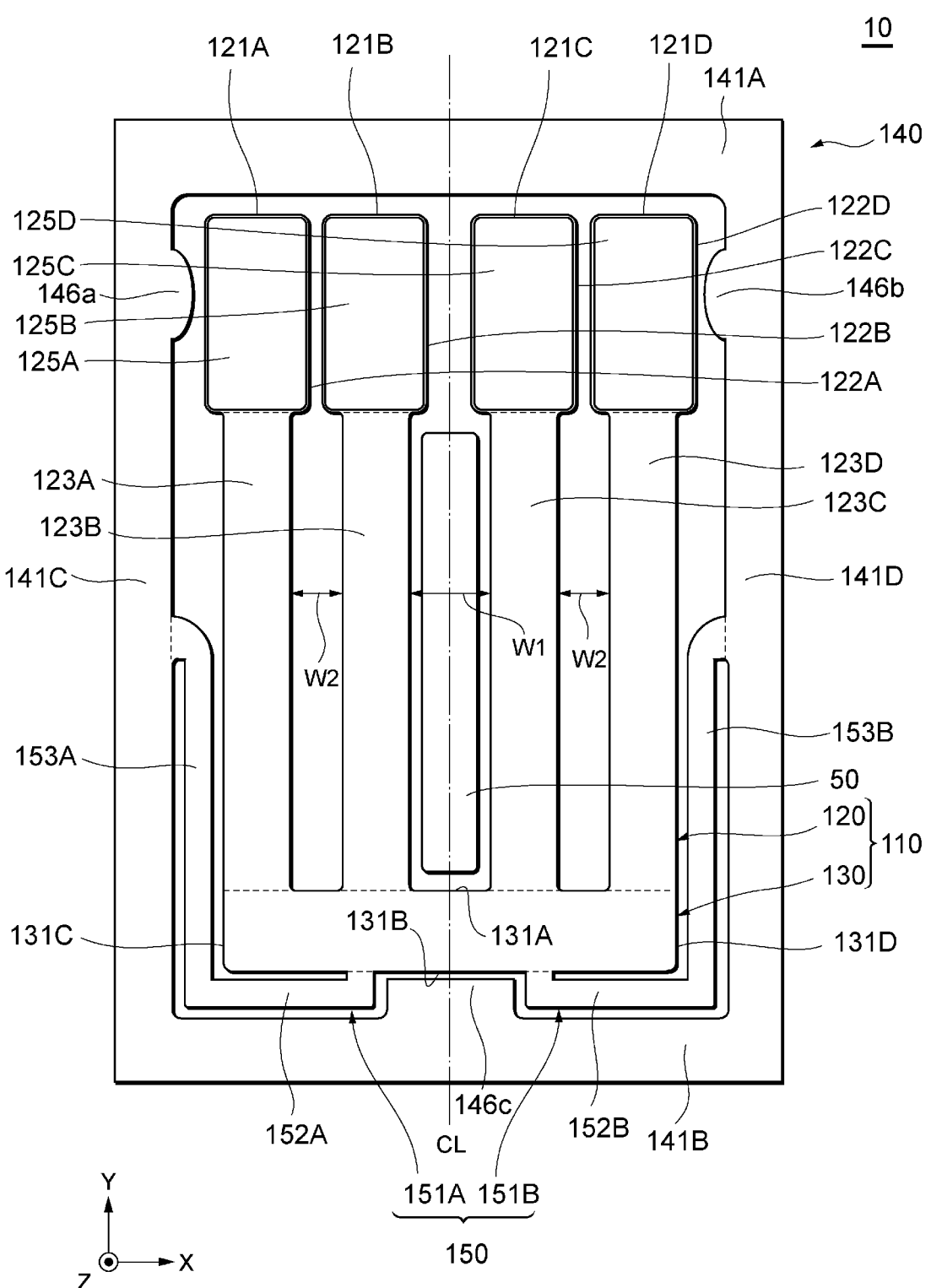
FIG. 3 is a plan view schematically illustrating a structure of the resonator illustrated in FIG. 2.

Next, a schematic configuration of the resonator according to the first exemplary embodiment will be described with reference to FIG. 3. FIG. 3 is a plan view schematically illustrating a structure of the resonator 10 illustrated in FIG. 2.

As illustrated in FIG. 3, the resonator 10 is a MEMS resonator manufactured using MEMS technology. The resonator 10 vibrates in the XY plane in an orthogonal coordinate system of FIG. 3 with an out-of-plane bending vibration mode as a main vibration (hereinafter also referred to as "main mode").

The resonator 10 includes a vibration section 110, a holding section 140, and a support arm section 150.

The vibration section 110 has a rectangular outline that extends along the XY plane in the orthogonal coordinate system of FIG. 3. The vibration section 110 is disposed inside the holding section 140 (also generally referred to as a "frame"), and a space is formed between the vibration section 110 and the holding section 140 with a predetermined gap therebetween. In the example of FIG. 3, the vibration section 110 includes an excitation part 120 and a base 130. The excitation part 120 includes four vibration arms 121A to 121D (hereinafter collectively referred to as "vibration arms 121"). The number of the vibration arms is not limited to four, and may be set to an arbitrary number, such as three or more, for example. In the exemplary embodiment, the excitation part 120 and the base 130 are integrally formed.

The vibration arms 121A to 121D each extend along a Y-axis direction, and are provided in parallel in this order at predetermined intervals in the X-axis direction. One end of the vibration arm 121A is a fixed end connected to a front end portion 131A of the base 130 to be described later. The other end of the vibration arm 121A is an open end provided at a distance from the front end portion 131A of the base 130. The vibration arm 121A includes a weight portion 122A (also referred to as a "eight") formed on the open end side, and an arm portion 123A formed on the fixed end side, extended from the fixed end, and connected to the weight portion 122A. Similarly, the vibration arms 121B, 121C, and 121D include weight portions 122B, 122C, and 122D, and arm portions 123B, 123C, and 123D, respectively. The arm portions 123A to 123D (hereinafter also collectively referred to as "arm portions 123" or simply "arms") each have a width of about 30 μm in the X-axis direction and a length of about 400 μm in the Y-axis direction, for example.

In the excitation part 120 of the exemplary embodiment, two vibration arms 121A and 121D are disposed outside in the X-axis direction, and two vibration arms 121B and 121C are disposed in the inner side portion. A width W1 (hereinafter referred to as "release width") of a gap formed between the arm portions 123B and 123C of the two vibration arms 121B and 121C in the inner side portion is set, for example, larger than a release width W2 between the arm portions 123A and 123B of the vibration arms 121A and 121B adjacent in the X-axis direction and a release width W2 between the arm portions 123D and 123C of the vibration arms 121D and 121C adjacent in the X-axis direction. The release width W1 is about 25 μm, for example. The release width W2 is about 10 μm, for example. By thus setting the release width W1 to be larger than the release width W2, vibration characteristics and durability of the vibration section 110 are improved. The release width W1 may be set smaller than or equal to the release width W2 so that the resonance device 1 is reduced in size.

The weight portions 122A to 122D (hereinafter also collectively referred to as "weight portions 122") are provided with mass adding films 125A to 125D (hereinafter also collectively referred to as "mass adding films 125") on their respective surfaces. Therefore, the weight per unit length (hereinafter also simply referred to as "weight") of each of the weight portions 122A to 122D is heavier than that of each of the arm portions 123A to 123D. This configuration improves the vibration characteristics while reducing the size of the vibration section 110. The mass adding films 125A to 125D have not only the function to increase the weight of the tip portions of the vibration arms 121A to 121D, but also the function as a so-called frequency adjustment film to adjust the resonance frequency of the vibration arms 121A to 121D by cutting a part thereof.

In the exemplary embodiment, the width of each of the weight portions 122A to 122D along the X-axis direction is, for example, about 49 μm, which is larger than the width of each of the arm portions 123A to 123D along the X-axis direction. This allows the weight of each of the weight portions 122A to 122D to be further increased. To reduce the size of the resonator 10, it is preferable that the width of each of the weight portions 122A to 122D along the X-axis direction is 1.5 times or more that of each of the arm portions 123A to 123D along the X-axis direction. However, the weight of each of the weight portions 122A to 122D only needs to be greater than that of each of the arm portions 123A to 123D. The width of each of the weight portions 122A to 122D along the X-axis direction is not limited to the example of the exemplary embodiment. The width of each of the weight portions 122A to 122D along the X-axis direction may be equal to or less than that of each of the arm portions 123A to 123D along the X-axis direction.

When the major surface of the resonator 10 is viewed in plan from above (hereinafter simply referred to as "plan view"), the weight portions 122A to 122D each have a so-called R shape, for example, which is substantially rectangular and curved with rounded corners. Similarly, the arm portions 123A to 123D each have a substantially rectangular shape and have an R shape near the fixed end connected to the base 130 and near the connecting portion connected to each of the weight portions 122A to 122D. However, the shapes of the weight portions 122A to 122D and the arm portions 123A to 123D are not limited to the example of the exemplary embodiment. For example, the weight portions 122A to 122D may have a substantially trapezoidal shape or a substantially L shape. The arm portions 123A to 123D may also have a substantially trapezoidal shape.

The base 130 has the front end portion 131A, a rear end portion 131B, a left end portion 131C, and a right end portion 131D in a plan view. As described above, the fixed ends of the vibration arms 121A to 121D are connected to the front end portion 131A. A support arm 151A of the support arm section 150 to be described later is connected to the rear end portion 131B.

The front end portion 131A, the rear end portion 131B, the left end portion 131C, and the right end portion 131D are each part of the outer edge portion of the base 130. Specifically, the front end portion 131A and the rear end portion 131B are end portions extending in the X-axis direction. The front end portion 131A and the rear end portion 131B are disposed so as to face each other. The left end portion 131C and the right end portion 131D are end portions extending in the Y-axis direction. The left end portion 131C and the right end portion 131D are disposed so as to face each other. The left end portion 131C has respective ends connected to one end of the front end portion 131A and one end of the rear end portion 131B. The right end portion 131D has respective ends connected to the other end of the front end portion 131A and the other end of the rear end portion 131B.

In a plan view, the base 130 has a substantially rectangular shape with the front end portion 131A and rear end portion 131B as long sides and the left end portion 131C and right end portion 131D as short sides. The base 130 is formed to be substantially symmetrical with respect to a defined virtual plane along the center line CL in the X-axis direction, which is a perpendicular bisector of the front end portion 131A and the rear end portion 131B. That is, it can be said that the base 130 is formed substantially symmetrically with respect to the center line CL. The shape of the base 130 is not limited to the rectangular shape illustrated in FIG. 3, but may be any other shape that is substantially linearly symmetrical with respect to the center line CL. For example, the shape of the base 130 may be a trapezoidal shape in which one of the front end portion 131A and the rear end portion 131B is longer than the other. At least one of the front end portion 131A, the rear end portion 131B, the left end portion 131C, and the right end portion 131D may be bent or curved.

The virtual plane corresponds to a symmetry plane of the entire vibration section 110. The center line CL corresponds to the center line of the entire vibration section 110 in the X-axis direction. Therefore, the center line CL is also a line passing through the centers of the vibration arms 121A to 121D in the X-axis direction, and is located between the vibration arms 121B and 121C. Specifically, the adjacent vibration arms 121A and 121B are formed symmetrically to the adjacent vibration arms 121D and 121C, respectively, with respect to the center line CL.

A base length of the base 130 is, for example, about 20 μm, which is the longest distance in the Y-axis direction between the front end portion 131A and the rear end portion 131B. A base width of the base 130 is, for example, about 180 μm, which is the longest distance in the X-axis direction between the left end portion 131C and the right end portion 131D. In the example illustrated in FIG. 3, the base length corresponds to the length of the left end portion 131C or the right end portion 131D, while the base width corresponds to the length of the front end portion 131A or the rear end portion 131B.

The holding section 140 is configured to hold the vibration section 110. More specifically, the holding section 140 is configured so that the vibration arms 121 can vibrate. Specifically, the holding section 140 is formed plane-symmetrically with respect to a virtual plane defined along the center line CL. The holding section 140 has a rectangular frame shape in a plan view, and is disposed so as to surround the outside of the vibration section 110 along the XY plane. Such a frame shape of the holding section 140 in a plan view makes it possible to easily realize the holding section 140 that surrounds the vibration section 110.

The holding section 140 only needs to be disposed at least in a part of the periphery of the vibration section 110, and is not limited to such a frame shape. For example, the holding section 140 may be disposed around the vibration section 110 to such an extent that the holding section can hold the vibration section 110 and can be joined to the upper cover 30 and the lower cover 20.

In the exemplary embodiment, the holding section 140 includes integrally formed frames 141A to 141D. As illustrated in FIG. 3, the frame 141A is provided facing the open ends of the vibration arms 121, with its longitudinal direction parallel to the X-axis. The frame 141B is provided facing the rear end portion 131B of the base 130, with its longitudinal direction parallel to the X-axis. The frame 141C is provided facing the left end portion 131C of the base 130 and the vibration arm 121A, with its longitudinal direction parallel to the Y-axis, and is connected to one ends of the frames 141A and 141D at each end thereof. The frame 141D is provided facing the right end portion 131D of the base 130 and the vibration arm 121A, with its longitudinal direction parallel to the Y-axis, and is connected to the other ends of the frames 141A and 141B at each end thereof. The frame 141A and the frame 141B face each other in the Y-axis direction across the vibration section 110. The frame 141C and the frame 141D face each other in the X-axis direction across the vibration section 110.

The support arm section 150 is disposed inside the holding section 140 and connects the base 130 to the holding section 140. The support arm section 150 is formed symmetrically with respect to the center line CL. Specifically, the support arm section 150 includes two support arms, a support arm 151A and a support arm 151B, in a plan view.

The support arm 151A includes a rear support arm 152A and a side support arm 153A. The support arm 151B includes a rear support arm 152B and a side support arm 153B.

The side support arm 153A extends parallel to the vibration arm 121A between the vibration arm 121A and the holding section 140. The side support arm 153B extends parallel to the vibration arm 121D between the vibration arm 121D and the holding section 140. Specifically, the side support arm 153A extends from one end (left end or end on the frame 141C side) of the rear support arm 152A to the frame 141A in the Y-axis direction, bends in the X-axis direction, and connects to the frame 141C. The side support arm 153B extends from one end (right end or end on the frame 141D side) of the rear support arm 152B to the frame 141A in the Y-axis direction, bends in the X-axis direction, and connects to the frame 141D. That is, the support arms 151A and 151B have their one ends connected to the holding section 140, respectively.

The rear support arm 152A extends from the side support arm 153A between the rear end portion 131B of the base 130 and the holding section 140. The rear support arm 152B extends from the side support arm 153B between the rear end portion 131B of the base portion 130 and the holding section 140. Specifically, the rear support arm 152A extends from one end (lower end or end on the frame 141B side) of the side support arm 153A in the X-axis direction to the frame 141D, bends in the Y-axis direction, and connects to the rear end portion 131B of the base 130. The rear support arm 152B extends from one end (lower end or end on the frame 141B side) of the side support arm 153B to the frame 141C in the X-axis direction, bends in the Y-axis direction, and connects to the rear end portion 131B of the base 130. That is, the support arms 151A and 151B have their other ends connected to the rear end portion 131B of the base 130, respectively.

The other ends of the support arms 151A and 151B are not limited to being connected to the rear end portion 131B. For example, the other end of the support arm 151A may be connected to the left end portion 131C of the base 130, and the other end of the support arm 151B may be connected to the right end portion 131D of the base 130. In the exemplary embodiment, the description is given of the example where the support arm section 150 includes two support arms. However, the current embodiment is not limited to this example, and the support arm section 150 may include one or three or more support arms in an alternative aspect.

The protrusion 50 protrudes into the vibration space from the recess 21 of the lower cover 20. More specifically, the protrusion 50 faces the gaps between the arm portions 123A to 123D of the two adjacent vibration arms 121A to 121D. Specifically, the protrusion 50 is disposed between the arm portion 123B of the vibration arm 121B and the arm portion 123C of the vibration arm 121C in a plan view. The protrusion 50 extends parallel to the arm portions 123B and 123C in the Y-axis direction, and is formed in a prismatic shape. The protrusion 50 has a length of about 240 μm in the Y-axis direction and has a length of about 15 μm in the X-axis direction.

The protrusion 50 thus faces the gaps between the arm portions 123A to 123D of the two adjacent vibration arms 121A to 121D. This configuration increases the rigidity of the resonance device 1 while suppressing an increase in arrangement interval of the plurality of vibration arms 121A to 121D.

The holding section 140 has projections 146a and 146b formed in positions facing the weight portions 122A to 122D of at least one of the plurality of vibration arms 121A to 121D in a plan view of the resonator 10. More specifically, the projection 146a is formed in a position facing the weight portion 122A of the vibration arm 121A on the frame 141C of the holding section 140. The projection 146a is a part of the frame 141C protruding in the positive direction of the X-axis. The projection 146b is formed in a position facing the weight portion 122D of the vibration arm 121D on the frame 141D of the holding section 140. The projection 146b is a part of the frame 141D protruding in the negative direction of the X-axis. Gaps in the X-axis direction between the projections 146a and 146b and the weight portions 122A and 122D are about 5 μm. Gaps in the X-axis direction between portions of the frames 141C and 141D other than the projections 146a and 146b and the weight portions 122A and 122D are about 10 μm.

The holding section 140 also has a projection 146c formed in a position facing the base 130 and at least one of the support arms 151A and 151B in a plan view. More specifically, the projection 146c is formed in a position facing the base 130 and both of the support arms 151A and 151B on the frame 141B of the holding section 140. The projection 146c is a part of the frame 141B protruding in the positive direction of the Y-axis. A gap in the Y-axis direction between the projection 146c and the base 130 and a gap in the X-axis direction between the projection 146c and the support arms 151A and 151B are both about 5 μm. For purposes of this disclosure, the projections 146a and 146b correspond to an example of a "first projection", and the projection 146c corresponds to an example of a "second projection".

In the holding section 140, from the viewpoint of suppressing charging and securing the vibration space for the resonator 10, only the portions of the frames 141C and 141D facing the weight portions 122A and 122D are projected, rather than narrowing (reducing) the gaps between the entire frames 141C and 141D and the weight portions 122A and 122D. For the same reason, in the holding section 140, the portion of the frame 141B facing the base 130 and at least one of the support arms 151A and 151B is projected, rather than narrowing (reducing) the gap between the entire frame 141B and the base 130 and the support arms 151A and 151B.

Figure 4:
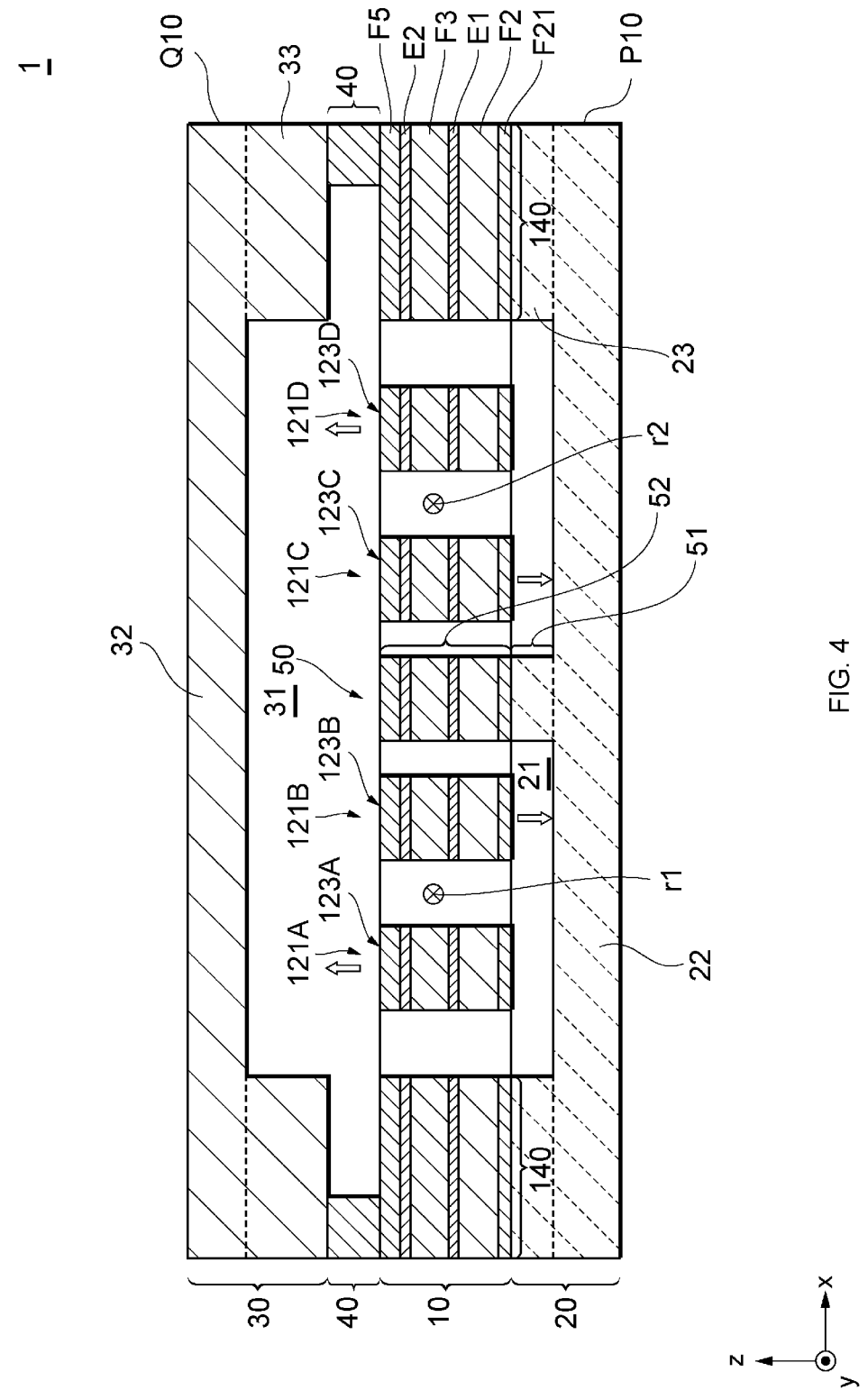
FIG. 4 is a cross-sectional view taken along line IV-IV in FIG. 2, schematically illustrating a configuration of the resonance device illustrated in FIG. 2.
Figure 5:
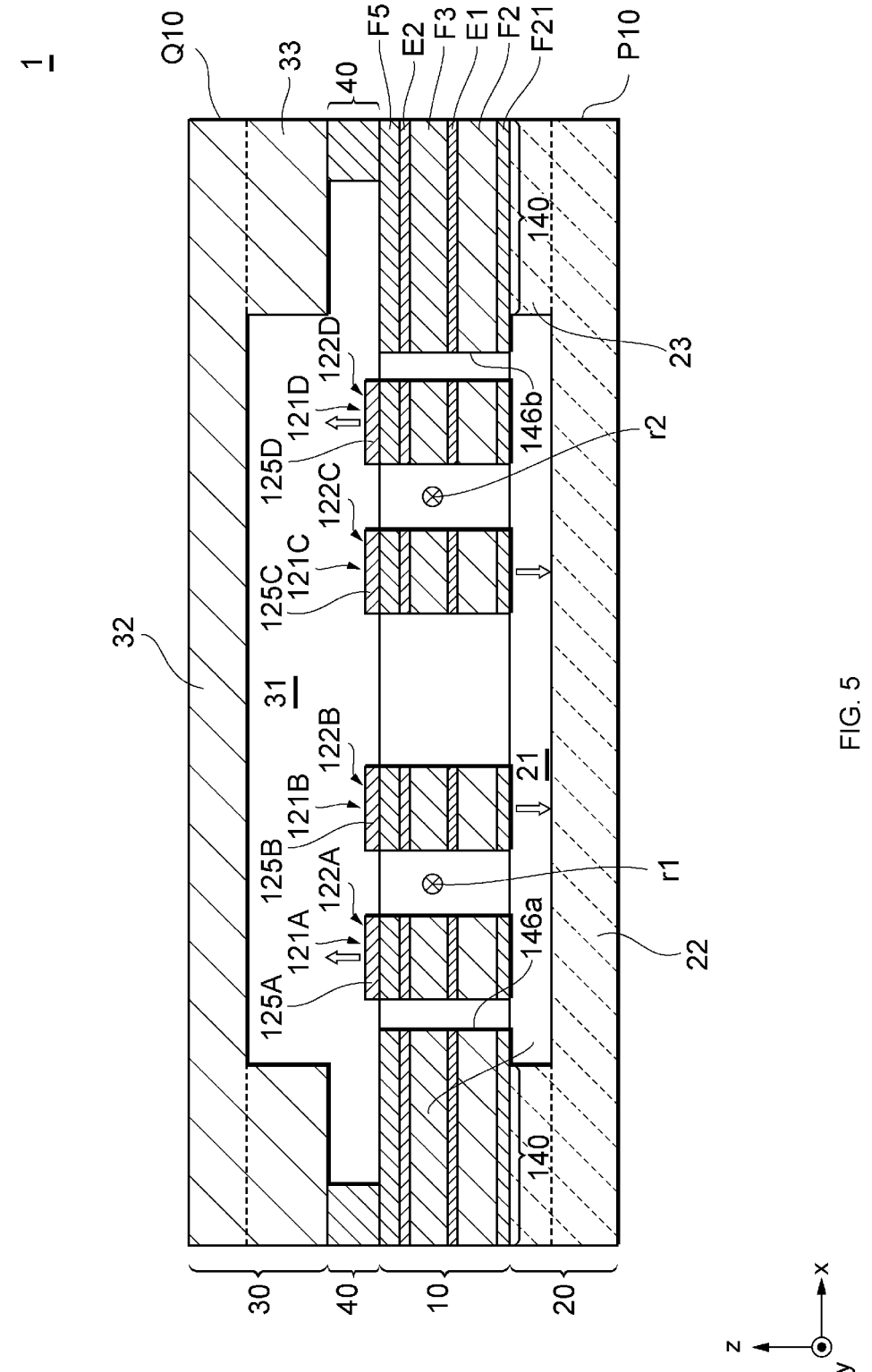
FIG. 5 is a cross-sectional view taken along line V-V in FIG. 2, schematically illustrating an example of the configuration of the resonance device illustrated in FIG. 2.
Figure 6:
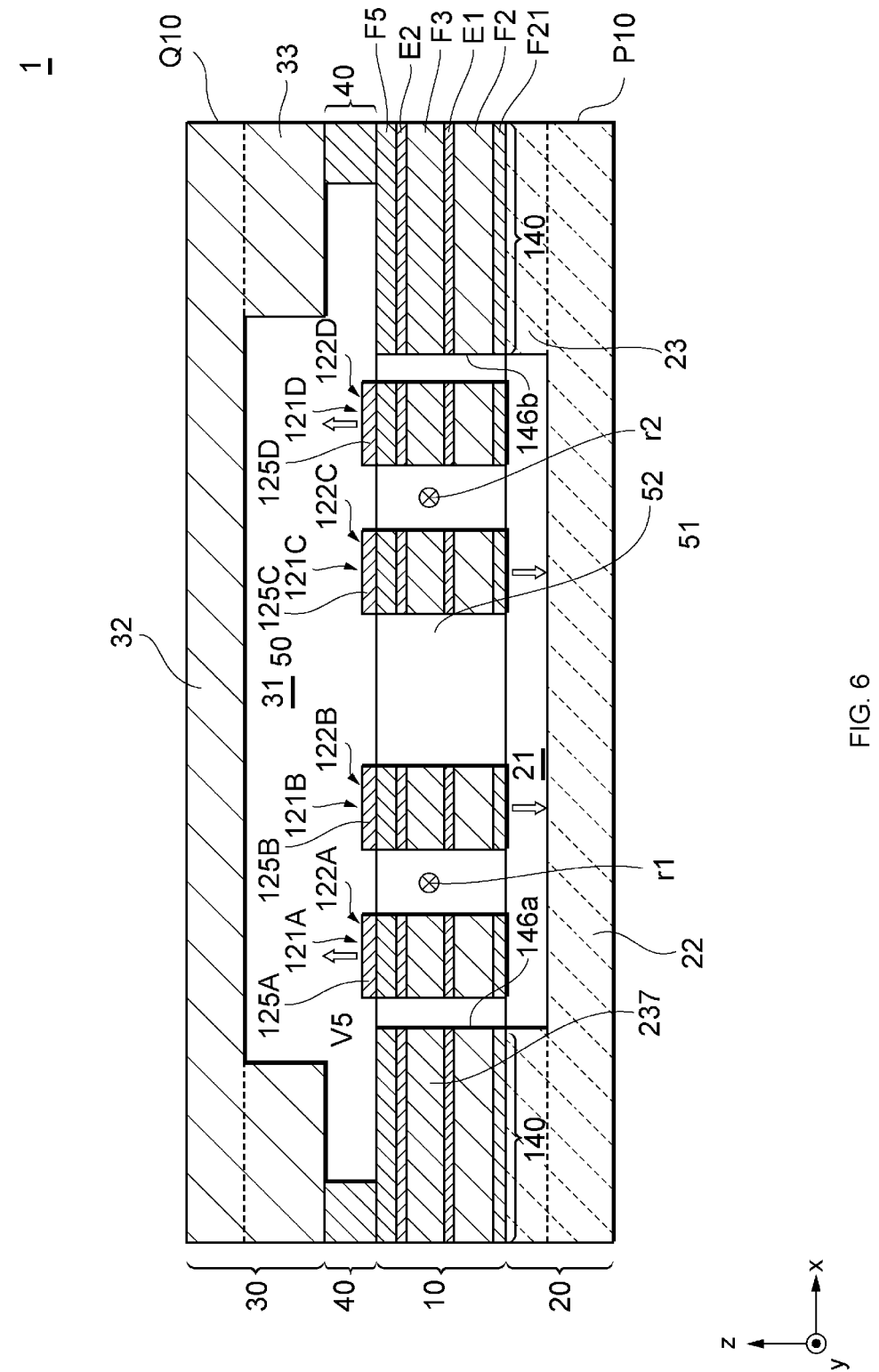
FIG. 6 is a cross-sectional view taken along line V-V in FIG. 2, schematically illustrating another example of the configuration of the resonance device illustrated in FIG. 2.
Figure 7:
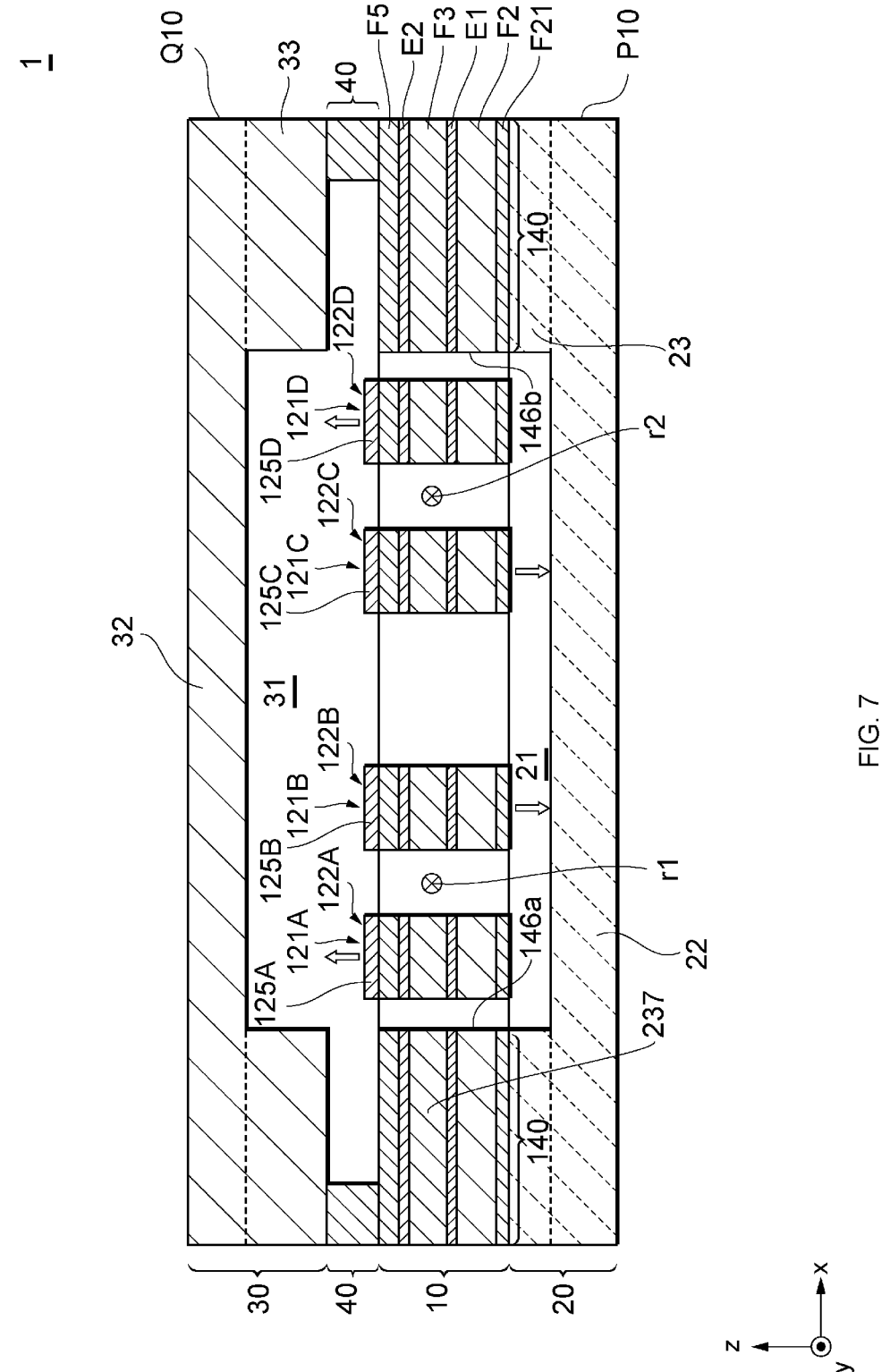
FIG. 7 is a cross-sectional view taken along line V-V in FIG. 2, schematically illustrating still another example of the configuration of the resonance device illustrated in FIG. 2.

Next, the multilayer structure and operations of the resonance device according to the first exemplary embodiment will be described with reference to FIGS. 4 to 7. FIG. 4 is a cross-sectional view taken along line IV-IV in FIG. 2, schematically illustrating the configuration of the resonance device 1 illustrated in FIG. 2. FIG. 5 is a cross-sectional view taken along line V-V in FIG. 2, schematically illustrating an example of the configuration of the resonance device 1 illustrated in FIG. 2. FIG. 6 is a cross-sectional view taken along line V-V in FIG. 2, schematically illustrating another example of the configuration of the resonance device 1 illustrated in FIG. 2. FIG. 7 is a cross-sectional view taken along line V-V in FIG. 2, schematically illustrating still another example of the configuration of the resonance device 1 illustrated in FIG. 2. The cross section in FIG. 4 is parallel to the frame 141A and passes through the arm portion 123 of the vibration arm 121. The cross sections in FIGS. 5 to 7 are parallel to the frame 141A and pass through the weight portion 122 of the vibration arm 121.

In the resonance device 1, as illustrated in FIGS. 4 and 5, the holding section 140 of the resonator 10 is joined to the sidewall 23 of the lower cover 20 and is further joined to the sidewall 33 of the upper cover 30. The resonator 10 is thus held between the lower cover 20 and the upper cover 30. The lower cover 20, the upper cover 30, and the holding section 140 of the resonator 10 form the vibration space in which the vibration section 110 of the resonator 10 vibrates.

The vibration section 110, the holding section 140, and the support arm section 150 in the resonator 10 are integrally formed by the same process. In the resonator 10, a metal film E1 is laminated on a Si substrate F2, which is an example of a substrate. A piezoelectric film F3 is laminated on the metal film E1 so as to cover the metal film E1, and a metal film E2 is further laminated on the piezoelectric film F3. A protective film F5 is laminated on the metal film E2 so as to cover the metal film E2. In the weight portions 122A to 122D illustrated in FIG. 5, the mass adding films 125A to 125D described above are further laminated on the protective film F5. The external shapes of the vibration section 110, the holding section 140, and the support arm section 150 are formed by patterning a multilayer body including the Si substrate F2, metal film E1, piezoelectric film F3, metal film E2, protective film F5, and the like described above by dry etching using an argon (Ar) ion beam, for example.

In the exemplary embodiment, the description is given of the example where the resonator 10 includes the metal film E1, but the current embodiment is not limited to this example. For example, in the resonator 10, use of a degenerate silicon substrate with low resistance as the Si substrate F2 allows the Si substrate F2 itself to serve as the metal film E1, and thus the metal film E1 may be omitted in an alternative aspect.

The Si substrate F2 is formed of a degenerate n-type silicon (Si) semiconductor having a thickness of about 6 μm, for example, and can contain phosphorus (P), arsenic (As), antimony (Sb), or the like as an n-type dopant. The degenerate silicon (Si) used for the Si substrate F2 has a resistance value of, for example, less than 1.6 mΩ·cm, more preferably 1.2 mΩ·cm or less. A silicon oxide layer F21 such as $SiO_2$, for example, is further formed as an example of a temperature characteristic correction layer below the Si substrate F2. This configuration improves temperature characteristics.

In the exemplary embodiment, the silicon oxide layer F21 is a layer that has a function to reduce a temperature coefficient of the frequency, that is, a rate of change per temperature in the vibration section 110 when the temperature correction layer is formed on the Si substrate F2 at least near room temperature, compared to the case where the silicon oxide layer F21 is not formed on the Si substrate F2. The silicon oxide layer F21 included in the vibration section 110 can reduce changes with temperature in the resonant frequency of the multilayer structure including the Si substrate F2, the metal films E1 and E2, the piezoelectric film F3, and the silicon oxide layer F21. The silicon oxide layer may be formed on the upper surface of the Si substrate F2, or may be formed on both the upper surface and lower surface of the Si substrate F2.

It is preferable that the silicon oxide layer F21 in the weight portions 122 is formed to have a uniform thickness. The uniform thickness means that the variation in the thickness of the silicon oxide layer F21 is within ±20% from the average thickness.

The metal films E1 and E2 each include an excitation electrode that excites the vibration arms 121, and an extended electrode that electrically connects the excitation electrode to an external power source. Portions of the metal films E1 and E2 that function as the excitation electrodes face each other across the piezoelectric film F3 in the arm portions 123 of the vibration arms 121. Portions of the metal films E1 and E2 that function as the extended electrodes are extended from the base 130 to the holding section 140 through the support arm section 150, for example. The metal film E1 is electrically continuous throughout the resonator 10. The metal film E2 is electrically separated between the portions formed in the vibration arms 121A and 121D and the portions formed in the vibration arms 121B and 121C.

The metal films E1 and E2 each have a thickness of, for example, about 0.1 μm or more and 0.2 μm or less. The metal films E1 and E2 after the formation thereof are patterned into excitation electrodes, extended electrodes, and the like by removal processing such as etching. The metal films E1 and E2 are formed of, for example, a metal material whose crystal structure is a body-centered cubic structure. Specifically, the metal films E1 and E2 are formed using molybdenum (Mo), tungsten (W) or the like. The metal films E1 and E2 are mainly composed of metal whose crystal structure is the body-centered cubic structure. This makes it possible to easily realize the metal films E1 and E2 suitable for a lower electrode and an upper electrode of the resonator 10.

The piezoelectric film F3 is a thin film formed of a type of piezoelectric material that mutually converts electrical energy and mechanical energy. The piezoelectric film F3 expands and contracts in the Y-axis direction of the in-plane directions of the XY plane according to an electric field formed in the piezoelectric film F3 by the metal films E1 and E2. This expansion and contraction of the piezoelectric film F3 cause the vibration arms 121A to 121D to displace their open ends toward the bottom plate 22 of the lower cover 20 and the bottom plate 32 of the upper cover 30, respectively. The resonator 10 thus vibrates in the out-of-plane bending vibration mode.

The thickness of the piezoelectric film F3 is, for example, about 1 μm, but may be about 0.2 μm to 2 μm. The piezoelectric film F3 is formed of a material having a wurtzite hexagonal crystal structure, and can consist mainly of a nitride or oxide such as aluminum nitride (AlN), scandium aluminum nitride (ScAlN), zinc oxide (ZnO), gallium nitride (GaN) and indium nitride (InN). The scandium aluminum nitride is aluminum nitride in which part of the aluminum is replaced with scandium. Instead of scandium, two elements such as magnesium (Mg) and niobium (Nb) or magnesium (Mg) and zirconium (Zr) may be used for replacement. The piezoelectric film F3 consists mainly of the piezoelectric material having the wurtzite hexagonal crystal structure. This makes it possible to easily realize the piezoelectric film F3 suitable for the resonator 10.

The protective film F5 protects the metal film E2 from oxidation. The protective film F5 does not need to be exposed to the bottom plate 32 of the upper cover 30 as long as the protective film is provided on the upper cover 30 side. For example, a parasitic capacitance reduction film or the like that reduces the capacitance of wiring formed in the resonator 10 may be formed so as to cover the protective film F5. The protective film F5 is made of, for example, a piezoelectric film of aluminum nitride (AlN), scandium aluminum nitride (ScAlN), zinc oxide (ZnO), gallium nitride (GaN), indium nitride (InN) or the like, as well as an insulating film of silicon nitride (SiN), silicon oxide (SiO$_2$), alumina oxide (Al$_2$O$_3$), tantalum pentoxide (Ta$_2$O$_5$) or the like. The protective film F5 is formed to have a thickness less than or equal to half the thickness of the piezoelectric film F3. In the exemplary embodiment, the protective film F5 has a thickness of about 0.2 μm, for example. It is more preferable that the thickness of the protective film F5 is about one quarter of the thickness of the piezoelectric film F3. When the protective film F5 is formed of a piezoelectric material such as aluminum nitride (AlN), it is preferable to use a piezoelectric material having the same orientation as the piezoelectric film F3.

It is preferable that the protective film F5 of the weight portions 122A to 122D is formed to have a uniform thickness. The uniform thickness means that the variation in the thickness of the protective film F5 is within ±20% from the average thickness.

The mass adding films 125A to 125D form the surfaces of the weight portions 122A to 122D on the upper cover 30 side, and correspond to frequency adjustment films of the vibration arms 121A to 121D, respectively. The frequency of the resonator 10 is adjusted by a trimming process to partially remove the mass adding films 125A to 125D. From the viewpoint of frequency adjustment efficiency, it is preferable that the mass adding films 125 are formed of a material whose mass reduction rate due to etching is faster than that of the protective film F5. The mass reduction rate is expressed by the product of etching rate and density. The etching rate is the thickness removed per unit time. The magnitude relationship of the etching rate between the protective film F5 and the mass adding film 125 is arbitrary as long as the relationship in mass reduction rate is as described above. From the viewpoint of efficiently increasing the weight of the weight portions 122, it is preferable that the mass adding films 125 are formed of a material having a high specific gravity. For these reasons, the mass adding films 125 are formed of a metal material such as molybdenum (Mo), tungsten (W), gold (Au), platinum (Pt), nickel (Ni), aluminum (Al), titanium (Ti) or the like.

The upper surfaces of the mass adding films 125A to 125D are partially removed by trimming in a frequency adjustment process. In an exemplary aspect, the trimming of the mass adding films 125 can be performed by dry etching using argon (Ar) ion beam irradiation, for example. Moreover, the ion beam can be irradiated over a wide range, thus leading to excellent processing efficiency. However, the ion beam has electric charges, which could charge the mass adding films 125. To prevent the vibration trajectory of the vibration arms 121 from changing due to Coulomb interaction caused by the charging of the mass adding films 125, leading to deterioration in vibration characteristics of the resonator 10, it is preferable that the mass adding films 125A to 125D are each grounded.

The bottom plate 22 and sidewall 23 of the lower cover 20 are integrally formed of a Si substrate P10. The Si substrate P10 is made of non-degenerate silicon, and has a resistivity of, for example, 10 Ω·cm or more. Inside the recess 21 of the lower cover 20, the Si substrate P10 is exposed.

The thickness of the lower cover 20 defined in the Z-axis direction is about 150 μm. The depth of the recess 21 similarly defined is about 50 μm.

As illustrated in FIG. 4, the protrusion 50 has a first layer 51 formed integrally with the Si substrate P10 of the lower cover 20, and a second layer 52 formed in the same process as the resonator 10. The second layer 52 is formed by laminating the silicon oxide layer F21, Si substrate F2, metal film E1, piezoelectric film F3, metal film E2, and protective film F5 described above in this order.

The bottom plate 32 and sidewall 33 of the upper cover 30 are integrally formed of a Si substrate Q10. It is preferable that the front and back surfaces of the upper cover 30 are covered with a silicon oxide film (not illustrated). This silicon oxide film is formed on the surface of the Si substrate Q10 by oxidation of the Si substrate Q10 or chemical vapor deposition (CVD), for example. Inside the recess 31 of the upper cover 30, the Si substrate Q10 is exposed. A getter layer (not illustrated) may be formed on the surface of the recess 31 of the upper cover 30, facing the resonator 10. This getter layer is formed of, for example, titanium (Ti) or the like, and sucks outgas released from a joint 40 or the like to be described later, thereby preventing reduction in a degree of vacuum in the vibration space. The getter layer may be formed on the surface of the recess 21 of the lower cover 20, facing the resonator 10. Alternatively, the getter layer may be formed on the surfaces of both the recess 21 of the lower cover 20 and the recess 31 of the upper cover 30, facing the resonator 10.

The thickness of the upper cover 30 defined in the Z-axis direction is about 150 μm. The depth of the recess 31 similarly defined is about 50 μm.

The joint 40 is formed between the sidewall 33 of the upper cover 30 and the holding section 140. This joint 40 connects the upper cover 30 to the resonator 10. The joint 40 is formed in a closed ring shape surrounding the vibration section 110 in the XY plane so as to hermetically seal the vibration space of the resonator 10 in a vacuum state. The joint 40 is formed of a metal film in which an aluminum (Al) film, a germanium (Ge) film, and an aluminum (Al) film, for example, are laminated in this order and bonded together by eutectic bonding. The joint 40 may be formed of a combination of films appropriately selected from among gold (Au), tin (Sn), copper (Cu), titanium (Ti), silicon (Si), and the like. To improve close contact, the joint 40 may contain a metal compound such as titanium nitride (TiN) or tantalum nitride (TaN) between the films.

In the exemplary embodiment, alternating voltages with opposite phases are applied so that the phase of the electric field formed in the piezoelectric film F3 of the vibration arms 121A and 121D and the phase of the electric field formed in the piezoelectric film F3 of the vibration arms 121B and 121C are opposite to each other. This causes the outer vibration arms 121A and 121D and the inner vibration arms 121B and 121C to be displaced in opposite directions.

For example, as indicated by the arrows in FIGS. 4 and 5, when the respective weight portions 122A and 122D and arm portions 123A and 123D of the vibration arms 121A and 121D are displaced toward the inner surface of the upper cover 30, the respective weight portions 122B and 122C and arm portions 123B and 123C of the vibration arms 121B and 121C are displaced toward the inner surface of the lower cover 20. Although not illustrated, conversely, when the respective weight portions 122A and 122D and arm portions 123A and 123D of the vibration arms 121A and 121D are displaced toward the inner surface of the lower cover 20, the respective weight portions 122B and 122C and arm portions 123B and 123C of the vibration arms 121B and 121C are displaced toward the inner surface of the upper cover 30. This causes at least two of the four vibration arms 121A to 121D to bend out of plane with different phases.

Thus, between the adjacent vibration arms 121A and 121B, the vibration arms 121A and 121B vibrate in vertically opposite directions around a central axis r1 extending in the Y-axis direction. Similarly, between the adjacent vibration arms 121C and 121D, the vibration arms 121C and 121D vibrate in vertically opposite directions around a central axis r2 extending in the Y-axis direction. This causes torsional moments in opposite directions between the central axis r1 and the central axis r2, resulting in bending vibration in the vibration section 110. The maximum amplitude of the vibration arms 121 is about 50 μm. The amplitude during normal driving is about 10 μm.

Here, the plurality of vibration arms 121A to 121D of the vibration section 110 each vibrate in the out-of-plane bending vibration mode. The resonance device 1 is therefore designed on the premise that the vibration arms 121 of the resonator 10 are displaced in the Z-axis direction.

In a resonance device of the related art, when the vibration arms are largely displaced in at least one of the X-axis direction and the Y-axis direction due to an impact such as a fall, an unexpectedly large stress may be generated in the resonator. As a result, a large stress is applied to a spot with the largest stress generated, for example, the support arm connecting the base and the holding section. There is therefore a risk that the support arm or the surrounding area of the support arm may be damaged.

As for recent resonance devices, there is a demand for further reduction in size, leading to restrictions (limitations) on the dimensions of each part of the resonance device. Therefore, in the resonance device, it is necessary to further reduce a gap or the like between a plurality of vibration arms, for example. This ends up taking away the space for providing a structure or the like for reducing the stress described above.

In the resonance device 1 according to the exemplary embodiment, on the other hand, the holding section 140 has the projections 146*a* and 146*b* formed in positions facing the weight portions 122A to 122D of at least one of the plurality of vibration arms 121A to 121D in a plan view of the resonator 10. These projections 146*a* and 146*b* limit the displacement of the vibration arms 121 in the X-axis and Y-axis directions when an impact such as a fall is applied. Therefore, stress generated in the resonator 10 by the impact is reduced, and damage to the resonator 10 due to the stress is suppressed. By limiting the displacement of the vibration arms 121 in the X-axis and Y-axis directions with the projections 146*a* and 146*b* formed in the holding section 140, an increase in dimensions of each part can be prevented, contributing to reduction in size of the resonance device 1, compared to the case where a structure or the like is provided in a gap between a plurality of vibration arms.

More specifically, the projections 146*a* and 146*b* protrude in the X-axis direction, which is the width direction of the vibration arms 121 in a plan view. The projections 146*a* and 146*b* face the weight portions 122A and 122D in the vibration arms 121A and 121D disposed on the outer side among the plurality of vibration arms 121A to 121D. Specifically, the projection 146*a* faces the weight portion 122A of the vibration arm 121A, and the projection 146*b* faces the weight portion 122D of the vibration arm 121D. The projections 146*a* and 146*b* can thus easily limit the displacement of the vibration arms 121 in the X-axis direction.

As described above, the resonator 10 further includes the support arms 151A and 151B that connect the base 130 to the holding section 140. The holding section 140 has the projection 146*c* formed in the position facing the base 130 and at least one of the support arms 151A and 151B in a plan view. This projection 146*c* can easily limit the displacement of the vibration arms 121 in the negative direction of the Y-axis.

In the resonance device 1, the structure of the cross section passing through the weight portions 122 of the vibration arms 121 is not limited to the example illustrated in FIG. 5. For example, as illustrated in FIG. 6, in addition to the projections 146*a* and 146*b* of the holding section 140 in the resonator 10, the sidewall 23 of the lower cover 20 may also partially protrude in the X-axis direction.

As illustrated in FIG. 7, in addition to the projections 146*a* and 146*b* of the holding section 140 in the resonator 10, the sidewall 33 of the upper cover 30 may also partially protrude in the X-axis direction. In this case, the sidewall 23 of the lower cover 20 may partially protrude in the X-axis direction together with the projections 146*a* and 146*b* and the sidewall 33 of the upper cover 30. Alternatively, only the projections 146*a* and 146*b* and the sidewall 33 may protrude in the X-axis direction without the sidewall 23 of the lower cover 20 protruding.

In the exemplary embodiment, the description is given of the example where the projections 146*a* and 146*b* of the holding section 140 face the weight portions 122A and 122D of the outer vibration arms 121A and 121D, but the current embodiment is not limited to this example.

(Modification)

Figure 8:
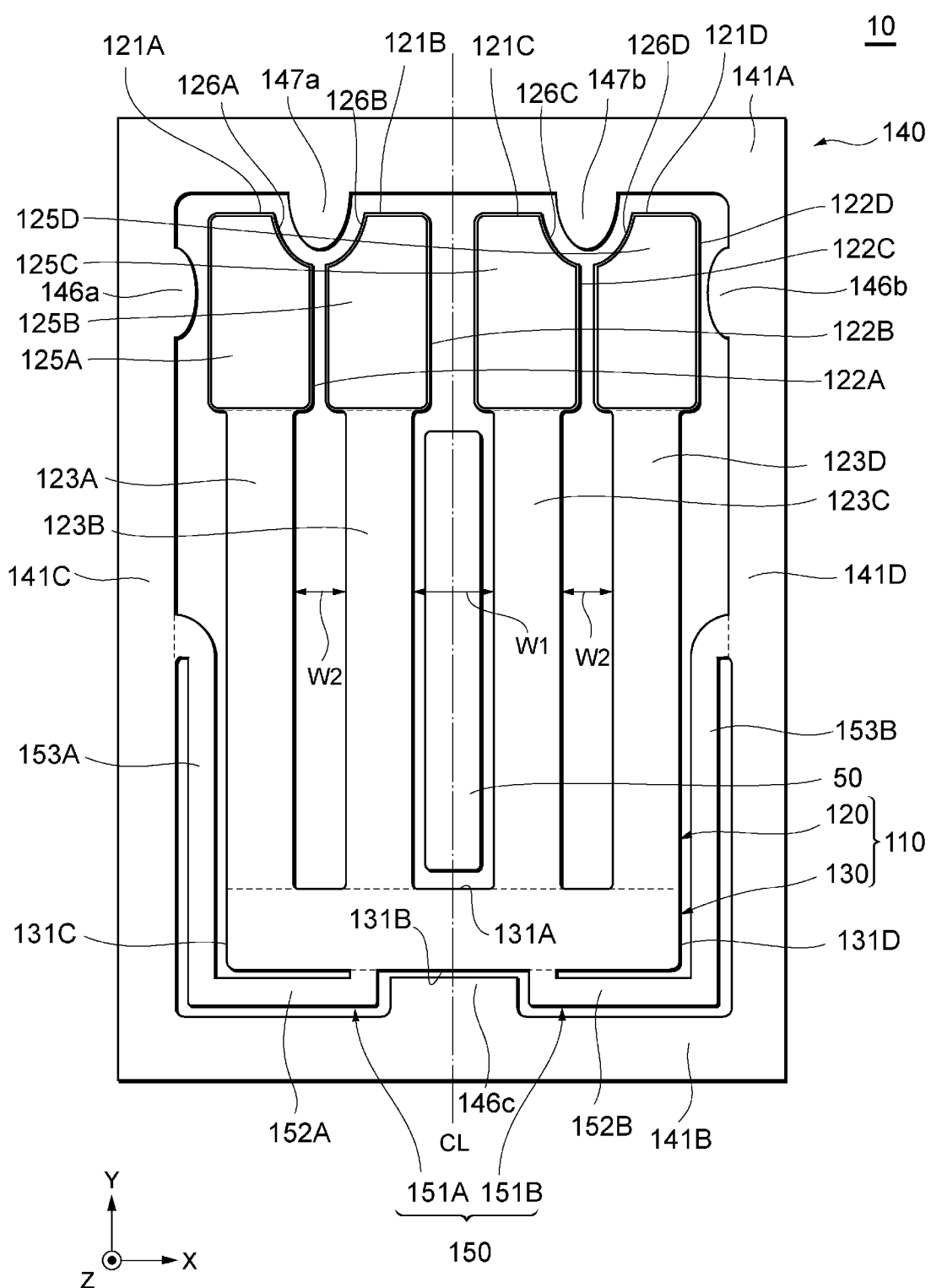
FIG. 8 is a plan view schematically illustrating a structure of a resonator according to a first modification of the first exemplary embodiment.
Figure 9:
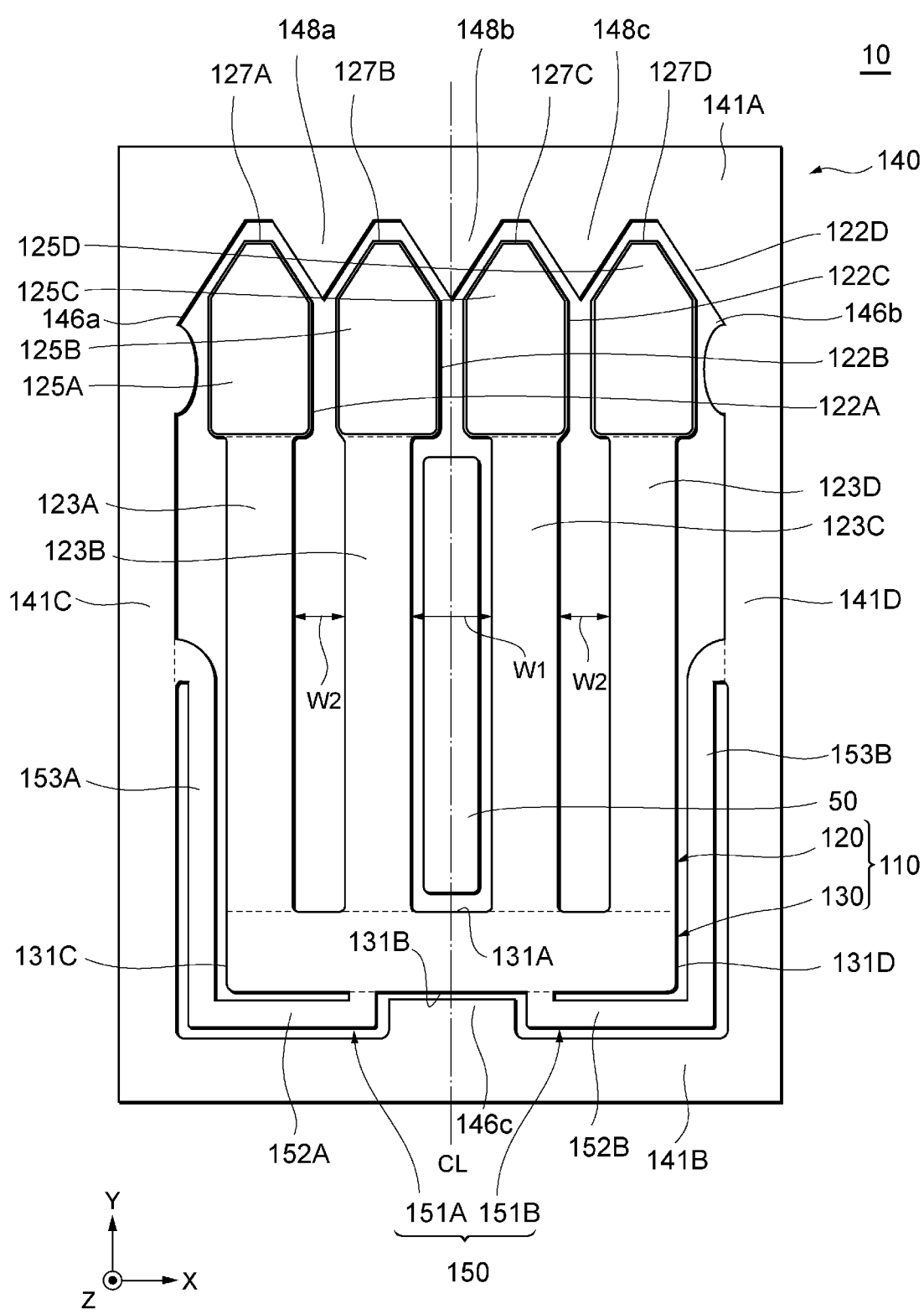
FIG. 9 is a plan view schematically illustrating a structure of a resonator according to a second modification of the first exemplary embodiment.

Next, a modification of the resonance device according to the first exemplary embodiment will be described with reference to FIGS. 8 and 9. FIG. 8 is a plan view schematically illustrating a structure of a resonator 10 according to a first modification of the first exemplary embodiment. FIG. 9 is a plan view schematically illustrating a structure of a resonator 10 according to a second modification of the first exemplary embodiment. Note that the same or similar configurations as those of the resonator 10 illustrated in FIG. 3 are denoted by the same or similar reference numerals, and description thereof will be omitted as appropriate. The same operation and effect by the same configuration will not be sequentially mentioned.

As illustrated in FIG. 8, in the resonator 10 according to the first modification, weight portions 122A to 122D of vibration arms 121A to 121D have notches 126A to 126D at their open ends, which are narrower than other part thereof in the width direction of the vibration arms 121A to 121D in a plan view. More specifically, adjacent corners of the weight portions 122A and 122B are cut off to form the notches 126A and 126B. Similarly, adjacent corners of the weight portions 122C and 122D are cut off to form the notches 126C and 126D. The notches 126A to 126D may each have a curved shape, that is, an R shape having at least one of a corner and a surface rounded.

The holding section 140 has projections 147a and 147b that protrude in the length direction of the vibration arms 121 in a plan view, together with or in place of the projections 146a and 146b. Specifically, the projections 147a and 147b are part of the frame 141A of the holding section 140 and protrude along the Y-axis direction.

In the frame 141A, the projections 147a and 147b are formed in positions facing the notches 126A to 126D formed in the weight portions 122. Specifically, the projection 147a faces the notches 126A and 126B, and the projection 147b faces the notches 126C and 126D.

The projections 147a and 147b thus protrude in the length direction of the vibration arm 121 in a plan view. These projections 147a and 147b can easily limit the displacement of the vibration arms 121 in the positive direction of the X-axis.

The weight portions 122A to 122D have the notches 126A to 126D at their open ends, which are narrower than other part thereof in the width direction of the vibration arms 121 in a plan view. The projections 147a and 147b face the notches 126A to 126D. The projections 147a and 147b protruding in the length direction of the vibration arms 121 in a plan view can be disposed so as to face the weight portions 122 while preventing an increase in dimensions in the length direction of the vibration arms 121 in the resonance device 1.

As illustrated in FIG. 9, in the resonator 10 according to the second modification, weight portions 122A to 122D of vibration arms 121A to 121D have tapered portions 127A to 127D, which are narrower toward the open ends in the width direction of the vibration arms 121 in a plan view. More specifically, the tapered portions 127A to 127D are formed in a tapered shape, which is obtained by cutting off the corners of the weight portions 122A to 122D at their open-end side. The tapered portions 127A to 127D may have a curved shape, that is, an R shape having at least one of a corner and a surface rounded.

The holding section 140 has projections 148a to 148c that protrude in the length direction of the vibration arms 121A to 121D in a plan view. Specifically, the projection 148a, the projection 148b, and the projection 148c are part of the frame 141A of the holding section 140 and protrude along the Y-axis direction.

In the frame 141A, the projections 148a to 148c are formed in positions facing the gaps between the tapered portions 127A to 127D of the weight portions 122A to 122D of the two adjacent vibration arms 121A to 121D. Specifically, in the two adjacent vibration arms 121A and 121B, the projection 148a protrudes in a gap between the tapered portion 127A of the weight portion 122A and the tapered portion 127B of the weight portion 122B and faces the tapered portion 127A and the tapered portion 127B in the gap. Similarly, in the two adjacent vibration arms 121B and 121C, the projection 148b protrudes in a gap between the tapered portion 127B of the weight portion 122B and the tapered portion 127C of the weight portion 122C and faces the tapered portion 127B and the tapered portion 127C in the gap. In the two adjacent vibration arms 121C and 121D, the projection 148c protrudes in a gap between the tapered portion 127C of the weight portion 122C and the tapered portion 127D of the weight portion 122D and faces the tapered portion 127C and the tapered portion 127D in the gap.

As described above, the weight portions 122A to 122D have the tapered portions 127A to 127D, which are narrower toward the open ends of the vibration arms 121 in the width direction in a plan view. The projections 148a to 148c face the gaps between the tapered portions 127A to 127D of the weight portions 122A to 122D in the two adjacent vibration arms 121A to 121D. Thus, the projections 148a to 148c protruding in the length direction of the vibration arms 121 in a plan view can be disposed so as to face the weight portions 122A to 122D of the two adjacent vibration arms 121A to 121D while preventing an increase in lengthwise dimensions of the vibration arms 121 in the resonance device 1.

In the exemplary embodiment, the description is given of the example where the vibration section 110 of the resonator 10 includes the four vibration arms 121A to 121D, but the exemplary embodiment is not limited to this example. For example, the vibration section 110 may include three or five or more vibration arms in an alternative aspect. In this case, at least two vibration arms bend out of plane with different phases.

Second Exemplary Embodiment

Next, a resonator and a resonance device according to a second exemplary embodiment will be described with reference to FIGS. 10 to 13. In each of the following embodiments, the same or similar configurations as those in the first exemplary embodiment are denoted by the same or similar reference numerals, differences from the first exemplary embodiment will be described. The same operation and effect by the same configuration will not be sequentially mentioned.

Figure 10:
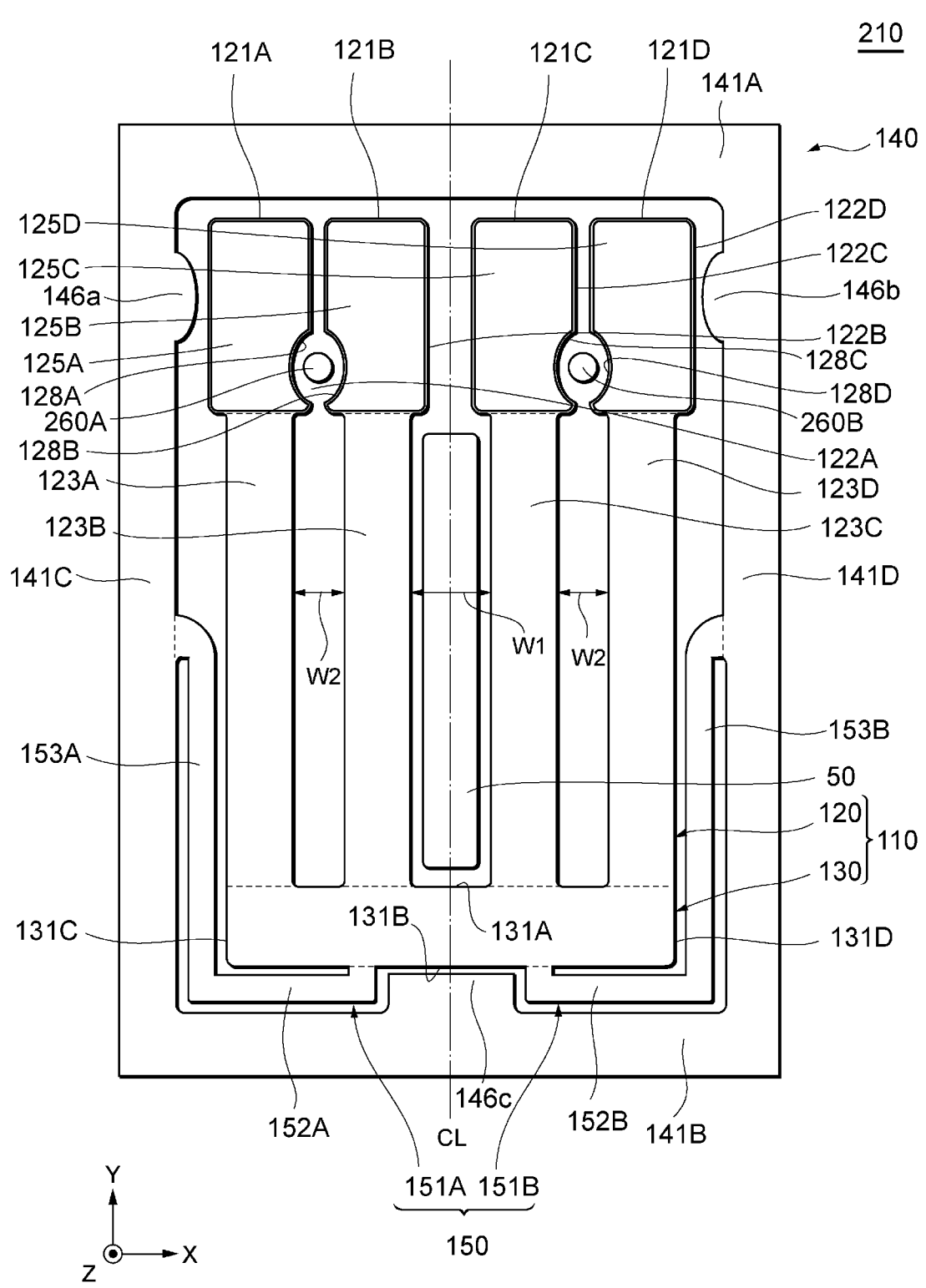
FIG. 10 is a plan view schematically illustrating a structure of a resonator according to a second exemplary embodiment.

First, a schematic configuration of a resonator according to the second exemplary embodiment will be described with reference to FIG. 10. FIG. 10 is a plan view schematically illustrating a structure of a resonator 210 according to the second exemplary embodiment. Note that FIG. 10 is a plan view corresponding to FIG. 3 in the first exemplary embodiment.

As illustrated in FIG. 10, in the resonator 210 according to the second exemplary embodiment, weight portions 122A to 122D of vibration arms 121A to 121D have recesses 128A to 128D, which are narrower than other part thereof in the width direction of the vibration arms 121 in a plan view. More specifically, the recesses 128A to 128D are formed between front ends, which are open ends of the vibration arms 121, and rear ends, which are connection ends with arm portions 123, in the weight portions 122A to 122D, respectively. The recesses 128A to 128D have a concave shape along the X-axis direction. The recesses 128A to 128D may have a curved shape, that is, an R shape having at least one of a corner and a surface rounded.

Although described in detail later, the resonance device 201 of the second exemplary embodiment differs from the resonance device 1 of the first exemplary embodiment in including two protrusions 260A and 260B. The protrusions 260A and 260B protrude from the inner surface of a lower cover 220 into a vibration space along the Z-axis direction and are formed in a substantially circular columnar shape in a plan view.

The resonance device 201 may also include a protrusion 50 as in the resonance device 1 of the first exemplary embodiment, in addition to the protrusions 260A and 260B. For purposes of this disclosure, it is noted that the protrusions 260A and 260B correspond to an example of a "first protrusion", and the protrusion 50 corresponds to an example of a "second protrusion".

The protrusion 50 thus faces a gap between the arm portions 123A to 123D of the two adjacent vibration arms 121A to 121D. This configuration increases the rigidity of the resonance device 201 while suppressing an increase in arrangement interval of the plurality of vibration arms 121A to 121D.

Figure 11:
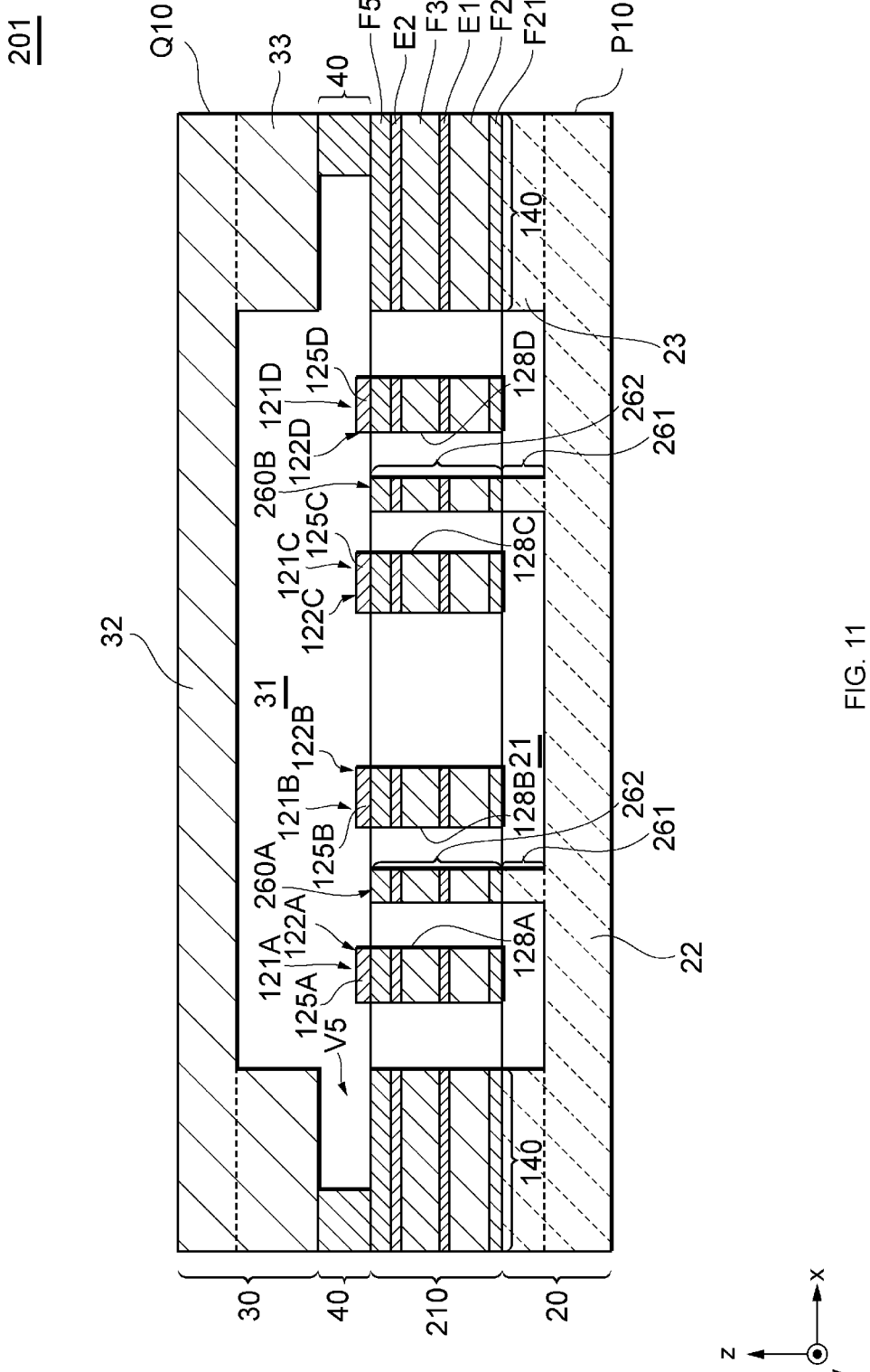
FIG. 11 is a cross-sectional view taken along an X-axis, schematically illustrating an example of a configuration of a resonance device according to the second embodiment.
Figure 12:
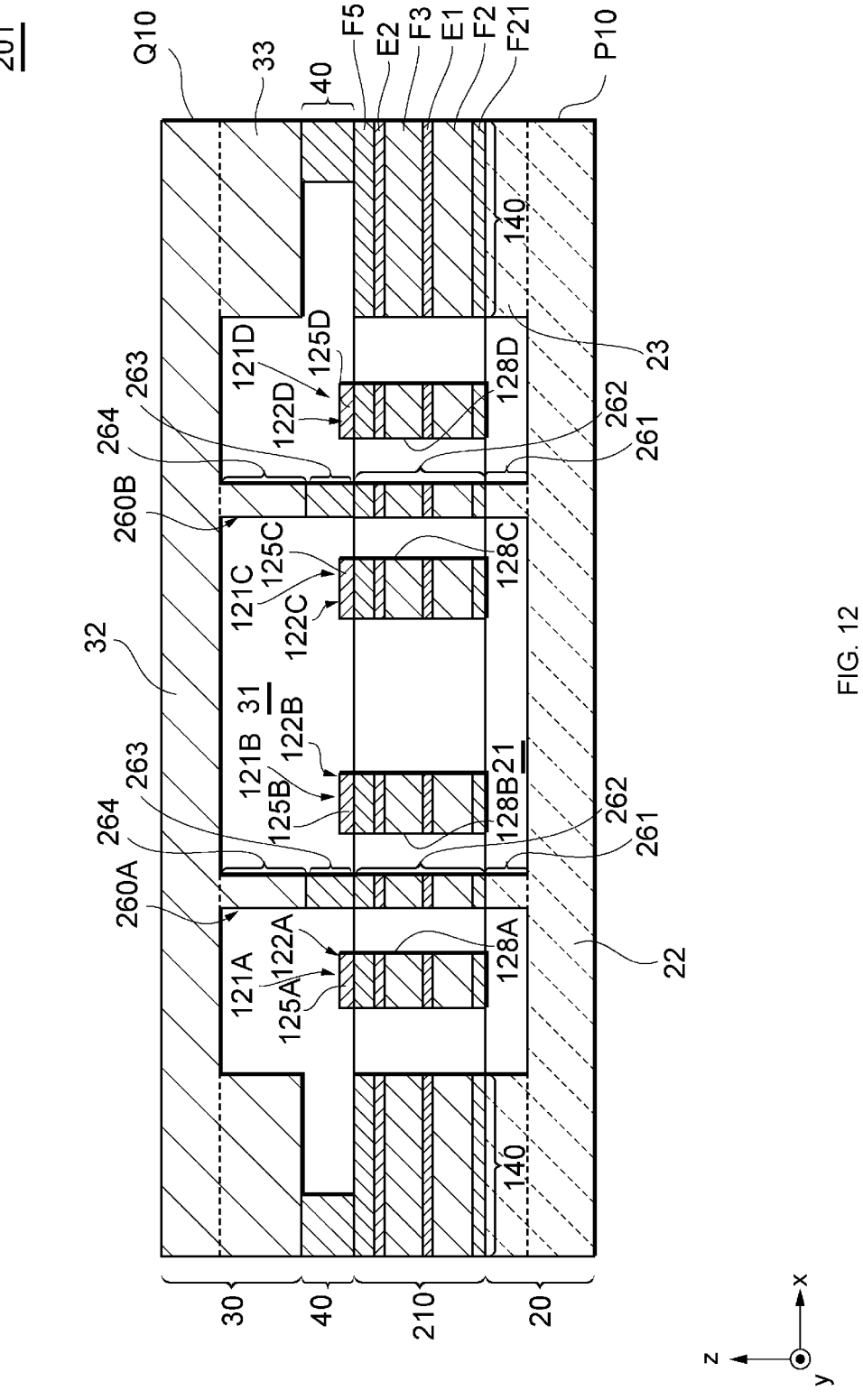
FIG. 12 is a cross-sectional view taken along the X-axis, schematically illustrating another example of the configuration of the resonance device according to the second exemplary embodiment.

Next, a multilayer structure of the resonance device according to the second exemplary embodiment will be described with reference to FIGS. 11 and 12. FIG. 11 is a cross-sectional view taken along the X-axis, schematically illustrating an example of the configuration of the resonance device 201 according to the second exemplary embodiment. FIG. 12 is a cross-sectional view taken along the X-axis, schematically illustrating another example of the configuration of the resonance device 201 according to the second exemplary embodiment. The cross sections in FIGS. 11 and 12 are parallel to the frame 141A and pass through the weight portions 122 of the vibration arms 121.

As illustrated in FIG. 11, the protrusions 260A and 260B protrude from the bottom plate 22 in the recess 21 of the lower cover 220 and extend along the Z-axis direction up to the height substantially flush with the upper surface of the resonator 210 (the surface facing the upper cover 30 in FIG. 11). The protrusions 260A and 260B include a first layer 261 formed integrally with a Si substrate P10 of the lower cover 220, and a second layer 262 formed in the same process as the resonator 10. The second layer 262 is formed by laminating a silicon oxide layer F21, a Si substrate F2, a metal film E1, a piezoelectric film F3, a metal film E2, and a protective film F5 in this order.

The protrusions 260A and 260B face the weight portions 122A to 122D of at least one of the plurality of vibration arms 121A to 121D. The protrusions 260A and 260B thus limit the displacement of the vibration arms 121 in the X-axis and Y-axis directions when an impact such as a fall is applied. Therefore, stress generated in the resonator 210 by the impact is reduced, and damage to the resonator 210 due to the stress is also suppressed.

More specifically, the protrusions 260A and 260B face the gaps between the recesses 128A to 128D in the weight portions 122A to 122D of the two adjacent vibration arms 121A to 121D. Specifically, the protrusion 260A extends and protrudes in the Z-axis direction into a gap between the recess 128A in the weight portion 122A and the recess 128B in the weight portion 122B in the two adjacent vibration arms 121A and 121B. The protrusion 260A faces the recesses 128A and 128B in the gap. Similarly, the protrusion 260B extends and protrudes in the Z-axis direction into a gap between the recess 128C in the weight portion 122C and the recess 128D in the weight portion 122D in the two adjacent vibration arms 121C and 121D. The protrusion 260B faces the recesses 128C and 128D in the gap.

Note that the protrusions 260A and 260B are not limited to protruding from the inner surface of the lower cover 220. Although not illustrated, the protrusions may protrude into the vibration space from the inner surface of the upper cover 30, for example. In this case, it is preferable that the protrusions extend along the Z-axis direction up to a height substantially flush with the lower surface of the resonator 210 (the surface facing the lower cover 220 in FIG. 11).

As described above, the weight portions 122A to 122D of the vibration arms 121A to 121D have the recesses 128A to 128D, which are narrower than other part thereof in the width direction of the vibration arms 121A to 121D in a plan view. The protrusions 260A and 260B face the gaps between the recesses 128A to 128D in the weight portions 122A to 122D of the two adjacent vibration arms 121A to 121D. The protrusions 260A and 260B protruding from the inner surface of the lower cover 220 or the upper cover 30 into the vibration space can thus be disposed so as to face the weight portions 122 while preventing an increase in dimensions of the vibration arms 121 in the width direction in the resonance device 201.

The cross-sectional structure of the protrusions 260A and 260B in the resonance device 201 according to the second exemplary embodiment is not limited to the example illustrated in FIG. 11. For example, as illustrated in FIG. 12, the protrusions 260A and 260B may extend along the Z-axis direction from the lower cover 220 to the upper cover 30. In this case, the protrusions 260A and 260B may further include a third layer 263 formed in the same process as the joint 40 and a fourth layer 264 integrally formed with the Si substrate Q10 of the upper cover 30, in addition to the first layer 261 and second layer 262 described above.

The protrusions 260A and 260B each have one end (the end on the negative direction side of the Z-axis in FIG. 12) connected to the inner surface of the lower cover 220, and have the other end (the end on the positive direction side of the Z-axis in FIG. 12) connected to the upper cover 30, thus further increasing the rigidity of the resonance device 201.

In the exemplary embodiment, the description is given of the example where the resonator 210 includes the two protrusions 260A and 260B, but the current embodiment is not limited to this example. The resonator 210 may include three or more protrusions, for example, in an alternative aspect. The protrusions 260A and 260B are not limited to being disposed between the weight portions 122A to 122D in the vibration arms 121A to 121D, but they may be disposed so as to face at least one of the weight portions 122A to 122D.

(Modification)

Figure 13:
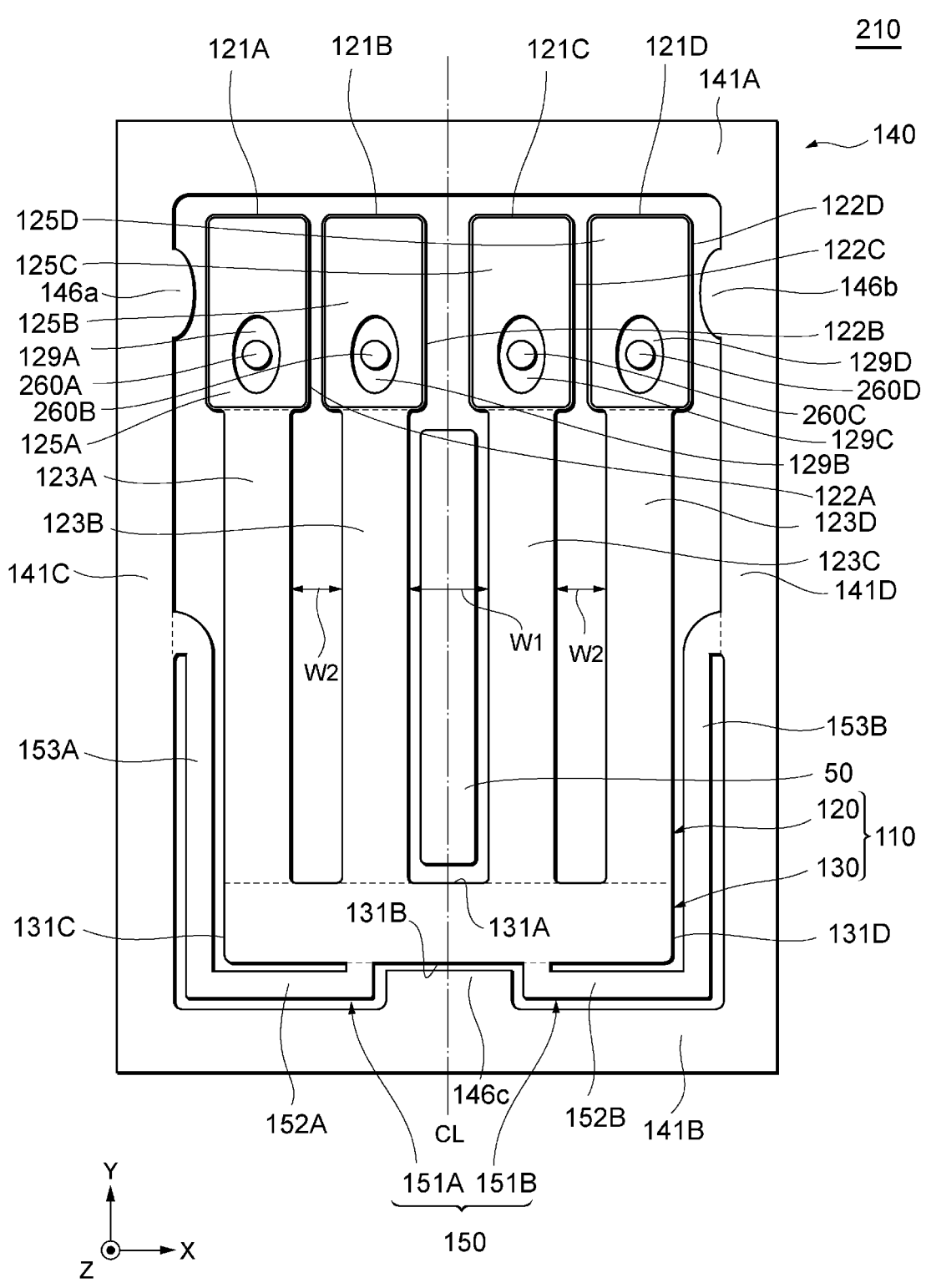
FIG. 13 is a plan view schematically illustrating a structure of a resonator according to a modification of the second exemplary embodiment.

Next, a modification of the resonator according to the second exemplary embodiment will be described with reference to FIG. 13. FIG. 13 is a plan view schematically illustrating a structure of a resonator 210 according to the modification of the second exemplary embodiment. Note that the same or similar configurations as those of the resonator 210 illustrated in FIG. 10 are denoted by the same or similar reference numerals, and description thereof will be omitted as appropriate. The same operation and effect by the same configuration will not be sequentially mentioned.

In the resonator 210 according to the modification, as illustrated in FIG. 13, weight portions 122A to 122D of vibration arms 121A to 121D have through-holes 129A to 129D, respectively. The through-holes 129A to 129D are formed between front ends, which are open ends of the vibration arms 121A to 121D, and rear ends, which are connection ends to arm portions 123A to 123D, in the weight portions 122A to 122D, respectively. These through-holes penetrate in the Z-axis direction, which is a thickness direction of the weight portions 122A to 122D. The through-holes 129A to 129D thus communicate a vibration space on the lower cover 220 side formed between the lower cover 220 and the resonator 210 with a vibration space on the upper cover 30 side formed between the upper cover 30 and the resonator 210. The openings of the through-holes 129A to 129D each have a circular, substantially circular, or elliptical shape, for example, in a plan view.

The resonance device 201 according to the modification includes four protrusions 260A to 260D. The protrusions 260A to 260D face the inner surfaces of the through-holes 129A to 129D in the weight portions 122A to 122D, respectively. Specifically, in a plan view, the protrusion 260A is disposed corresponding to the position in the X-axis direction and the position in the Y-axis direction where the through-hole 129A is formed, and extends in the Z-axis direction through the through-hole 129A. The protrusion 260B is disposed corresponding to the position in the X-axis direction and the position in the Y-axis direction where the through-hole 129B is formed in a plan view, and extends in the Z-axis direction through the through-hole 129B. The protrusion 260C is disposed corresponding to the position in the X-axis direction and the position in the Y-axis direction where the through-hole 129C is formed in a plan view, and extends in the Z-axis direction through the through-hole 129C. The protrusion 260D is disposed corresponding to the position in the X-axis direction and the position in the Y-axis direction where the through-hole 129D is formed in a plan view, and extends in the Z-axis direction through the through-hole 129D.

As described above, the weight portions 122A to 122D of the vibration arms 121A to 121D have the through-holes 129A to 129D that communicate the vibration space on the lower cover 220 side with the vibration space on the upper cover 30 side across the resonator 210. The protrusions 260A to 260D face the inner surfaces of the through-holes 129A to 129D in the weight portions 122A to 122D. The protrusions 260A to 260D protruding from the inner surface of the lower cover 220 or the upper cover 30 into the vibration space can thus be disposed so as to face the weight portions 122A to 122D without increasing the dimensions of the resonance device 201.

In general, it is noted that the exemplary embodiments of the present invention have been described above. In the resonance device according to the first exemplary embodiment, the holding section has the projection formed in the position facing the weight portion of at least one of the plurality of vibration arms in a plan view of the resonator. This projection limits the displacement of the vibration arm in the X-axis and Y-axis directions when an impact such as a fall is applied. Therefore, stress generated in the resonator by the impact is reduced, and damage to the resonator due to the stress can also be suppressed. By limiting the displacement of the vibration arm in the X-axis and Y-axis directions with the projections formed in the holding section, an increase in dimensions of each part can be prevented, thus contributing to reduction in size of the resonance device, compared to the case where a structure is provided in a gap between the plurality of vibration arms.

In the resonance device described above, the projection protrudes in the length direction of the vibration arm in a plan view. This projection can easily limit the displacement of the vibration arm in the positive direction of the X-axis.

In the resonance device described above, the weight portion has the notch at its open end, which is narrower than other part thereof in the width direction of the vibration arm in a plan view, and the projection faces the notch. The projection protruding in the length direction of the vibration arm in a plan view can be disposed so as to face the weight portion while preventing an increase in lengthwise dimensions of the vibration arms in the resonance device.

In the resonance device described above, the weight portion has the tapered portion, which is narrower toward the open end in the width direction of the vibration arm in a plan view. The projection faces the gap between the tapered portions of the weight portions of two adjacent vibration arms. The projections protruding in the length direction of the vibration arms in a plan view can thus be disposed so as to face the weight portions of the two adjacent vibration arms while preventing an increase in lengthwise dimensions of the vibration arms in the resonance device.

Moreover, in the resonance device described above, the projections protrude in the width direction of the vibration arms in a plan view, and face the weight portions of the vibration arms disposed in the outer side portion among the plurality of vibration arms. The projections can easily limit the displacement of the vibration arms in the X-axis direction.

In the resonance device described above, the resonator further includes the support arm connecting the base to the holding section. The holding section has the projection formed in the position facing at least one of the base and the support arm in a plan view. This projection can easily limit the displacement of the vibration arms in the negative direction of the Y-axis.

In the resonance device described above, the protrusion faces the gap between the arm portions of two adjacent vibration arms. This configuration increases the rigidity of the resonance device while suppressing an increase in arrangement interval of the plurality of vibration arms.

In the resonance device according to the second embodiment, the protrusion protrudes from the inner surface of the lower cover or the upper cover into the vibration space and faces the weight portion of at least one of the plurality of vibration arms. This protrusion limits the displacement of the vibration arms in the X-axis and Y-axis directions when an impact such as a fall is applied. Therefore, stress generated in the resonator by the impact is reduced, and damage to the resonator due to the stress is also suppressed.

In the resonance device described above, the weight portion has the recesses narrower than other part thereof in the width direction of the vibration arm in a plan view. The protrusions face the gap between the recesses in the weight portions of two adjacent vibration arms. The protrusions protruding from the inner surface of the lower cover or the upper cover into the vibration space can be disposed so as to face the weight portions while preventing an increase in dimensions in the width direction of the vibration arms in the resonance device.

In the resonance device described above, the weight portion has the through-hole that communicates the vibration space on the lower cover side with the vibration space on the upper cover side across the resonator. The protrusion faces the inner surface of the through-hole in the weight portion. The protrusion protruding from the inner surface of the lower cover or the upper cover into the vibration space can be disposed so as to face the weight portion without increasing the dimensions of the resonance device.

In the resonance device described above, the protrusion has one end connected to the inner surface of the lower cover 220 and the other end connected to the upper cover. This can further increase the rigidity of the resonance device.

In the resonance device described above, the protrusion faces the gap between the arm portions of two adjacent vibration arms. This configuration increases the rigidity of the resonance device while suppressing an increase in arrangement interval of the plurality of vibration arms.

In general, it is also noted that the exemplary embodiments described above are intended to facilitate understanding of the present invention and are not intended to be interpreted as limiting. The exemplary embodiments may be modified and improved without departing from its spirit, and the present invention also includes equivalents thereof. That is, the embodiments and/or modifications made by those skilled in the art as appropriate are included within the scope of the present invention as long as they have the features of the present invention. For example, each element included in the embodiments and/or modifications, its arrangement, material, conditions, shape, size, and the like are not limited to those illustrated and can be changed as appropriate. Further, the embodiments and modifications are merely examples, and it goes without saying that partial substitutions or combinations of the configurations described in different embodiments and/or modifications are possible, and these are also included in the scope of the present invention as long as they include the features of the present invention.

REFERENCE SIGNS LIST

1 RESONANCE DEVICE
10 RESONATOR
20 LOWER COVER
21 RECESS
22 BOTTOM PLATE
23 SIDEWALL
30 UPPER COVER
31 RECESS
32 BOTTOM PLATE
33 SIDEWALL
40 JOINT
50 PROTRUSION
51 FIRST LAYER
52 SECOND LAYER
110 VIBRATION SECTION
120 EXCITATION PART
121, 121A, 121B, 121C, 121D VIBRATION ARM
122, 122A, 122B, 122C, 122D WEIGHT PORTION
123, 123A, 123B, 123C, 123D ARM PORTION
125, 125A, 125B, 125C, 125D MASS ADDING FILM
126A, 126B, 126C, 126D NOTCH
127A, 127B, 127C, 127D TAPERED PORTION
128A, 128B, 128C, 128D RECESS
129A, 129B, 129C, 129D THROUGH-HOLE
130 BASE
131A FRONT END PORTION
131B REAR END PORTION
131C LEFT END PORTION
131D RIGHT END PORTION
140 HOLDING SECTION
141A, 141B, 141C, 141D FRAME
146a, 146b, 146c PROJECTION
147a, 147b PROJECTION
148a, 148b, 148c PROJECTION
150 SUPPORT ARM SECTION
151A, 151B SUPPORT ARM
152A, 152B REAR SUPPORT ARM
153A, 153B SIDE SUPPORT ARM
201 RESONANCE DEVICE

210 RESONATOR
220 LOWER COVER
260A, 260B, 260C, 260D PROTRUSION
261 FIRST LAYER
262 SECOND LAYER
263 THIRD LAYER
264 FOURTH LAYER
CL CENTER LINE
E1, E2 METAL FILM
F2 Si SUBSTRATE
F3 PIEZOELECTRIC FILM
F5 PROTECTIVE FILM
F21 SILICON OXIDE LAYER
P10 Si SUBSTRATE
Q10 Si SUBSTRATE
r1, r2 CENTRAL AXIS
W1, W2 RELEASE WIDTH

The invention claimed is:

1. A resonance device comprising:
a resonator including a base, three or more vibration arms extending parallel to each other and each having a fixed end connected to the base and a weight portion on an open end, and a frame disposed at least in a part of a periphery of the three or more vibration arms and configured to hold the base;
a first substrate and a second substrate that form a vibration space that accommodates the resonator; and
a protrusion that protrudes into the vibration space from an inner surface of at least one of the first substrate or the second substrate,
wherein the frame includes a first projection disposed at a position that faces the weight portion of at least one vibration arm of the three or more vibration arms in a plan view of the resonator, and
wherein the first projection protrudes in a width direction of the three or more vibration arms in the plan view and faces the weight portion of the respective vibration arm disposed in an outer side portion among the three or more vibration arms.

2. The resonance device according to claim 1, wherein the three or more vibration arms are configured to vibrate in an out-of-plane bending vibration mode as a main vibration.

3. The resonance device according to claim 1, wherein the first projection protrudes in a length direction of the three or more vibration arms in the plan view.

4. The resonance device according to claim 3, wherein the weight portion of the at least one vibration arm has a notch at the open end that is narrower than other parts of the weight portion in a width direction of each of the three or more vibration arms in the plan view.

5. The resonance device according to claim 3, wherein the weight portion of each of the three or more vibration arms has a tapered portion that is narrower towards the open end in a width direction of each respective vibration arm in the plan view.

6. The resonance device according to claim 5, wherein the first projection faces a gap between tapered portions in the weight portions of two adjacent vibration arms of the three or more vibration arms.

7. The resonance device according to claim 1,
wherein the resonator further includes a support arm connecting the base to the frame holding section, and
wherein the frame further includes a second projection disposed at a position facing at least one of the base and the support arm in the plan view.

8. The resonance device according to claim 1, wherein the protrusion faces a gap between two adjacent vibration arms among the three or more vibration arms.

9. A resonance device comprising:

a resonator including a base, three or more vibration arms extending parallel to each other and each having a fixed end connected to the base and weight portions on an open end, and a frame disposed at least in a part of a periphery of the three or more vibration arms and configured to hold the base;

a first substrate and a second substrate that form a vibration space that accommodates the resonator; and a protrusion that protrudes into the vibration space from an inner surface of at least one of the first substrate or the second substrate, wherein the frame includes a first projection disposed at a position that faces the weight portion of at least one vibration arm of the three or more vibration arms in a plan view of the resonator, wherein the first projection protrudes in a length direction of the at least one vibration arm in the plan view, wherein the weight portion of the at least one vibration arm has a notch at the open end that is narrower than other parts of the weight portion in a width direction of the at least one vibration arm in the plan view, and wherein the first projection faces the notch.

10. A resonance device comprising:

a resonator including a base, a plurality of vibration arms each having a fixed end connected to the base and weight portions on an open end, and a frame disposed around at least a part the plurality of vibration arms and configured to hold the base, the plurality of vibration arms extending parallel to each other;

a first substrate and a second substrate that form a vibration space that accommodates the resonator; and a first protrusion that protrudes into the vibration space from an inner surface of at least one of the first substrate and the second substrate and that faces a weight portion of at least one vibration arm of the plurality of vibration arms, wherein the first protrusion has one end connected to an inner surface of the first substrate and another end connected to an inner surface of the second substrate.

11. The resonance device according to claim 10, wherein the plurality of vibration arms are configured to vibrate in an out-of-plane bending vibration mode as a main vibration.

12. The resonance device according to claim 10, wherein the weight portion of the at least one vibration arm has a recess that is narrower than other parts of the weight portion in a width direction of the at least one vibration arm in a plan view of the resonator.

13. The resonance device according to claim 12, wherein the first protrusion faces a gap between recesses in the respective weight portions of two adjacent vibration arms of the plurality of vibration arms.

14. The resonance device according to claim 10, wherein the weight portion of the at least one vibration arm has a through-hole that communicates with the vibration space on a side of the first substrate with the vibration space on a side of the second substrate across the resonator.

15. The resonance device according to claim 14, wherein the first protrusion faces an inner surface of the through-hole.

16. The resonance device according to claim 10, further comprising:

a second protrusion that protrudes from at least one of the inner surface of the first substrate and the second substrate into the vibration space, and faces a gap between the two adjacent vibration arms.

17. The resonance device according to claim 10, wherein the frame includes a projection disposed at a position that faces the weight portion of the at least one vibration arm in a plan view of the resonator.

18. The resonance device according to claim 17, wherein the projection protrudes in a width direction of the plurality of vibration arms in the plan view and faces the weight portion of the at least one vibration arm disposed in an outer side portion among the plurality of vibration arms.

* * * * *